US 12,046,280 B2

(12) United States Patent
Wang et al.

(10) Patent No.: US 12,046,280 B2
(45) Date of Patent: Jul. 23, 2024

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Xiaoguang Wang, Hefei (CN); Dinggui Zeng, Hefei (CN); Huihui Li, Hefei (CN); Jiefang Deng, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 132 days.

(21) Appl. No.: 17/809,642

(22) Filed: Jun. 29, 2022

(65) Prior Publication Data

US 2023/0377644 A1    Nov. 23, 2023

Related U.S. Application Data

(63) Continuation of application No. PCT/CN2022/099216, filed on Jun. 16, 2022.

(30) Foreign Application Priority Data

May 18, 2022    (CN) .......................... 202210538052.9

(51) Int. Cl.
 G11C 11/56     (2006.01)
 H10B 63/00     (2023.01)
 H10N 70/00     (2023.01)

(52) U.S. Cl.
 CPC .......... G11C 11/5678 (2013.01); H10B 63/30 (2023.02); H10N 70/021 (2023.02);
 (Continued)

(58) Field of Classification Search
 None
 See application file for complete search history.

(56) References Cited

U.S. PATENT DOCUMENTS 7,767,568 B2 *  8/2010  An ........................ H10B 63/20
                                                438/666
8,111,540 B2 *  2/2012  Asao .................... G11C 11/1659
                                                365/158
(Continued)

FOREIGN PATENT DOCUMENTS

CN    101359503 A    2/2009
CN    102881823 A    1/2013
(Continued)

OTHER PUBLICATIONS

International Search Report cited in PCT/CN2022/099216 mailed Dec. 21, 2022, 9 pages.
(Continued)

*Primary Examiner* — Tan T. Nguyen
(74) *Attorney, Agent, or Firm* — Kilpatrick Townsend & Stockton LLP

(57) ABSTRACT

The present disclosure relates to a semiconductor structure and a manufacturing method thereof. The semiconductor structure includes a transistor; a first phase change memory structure, a bottom electrode of the first phase change memory structure being electrically connected to a first terminal (source or drain) of the transistor; a second phase change memory structure, a top electrode of the second phase change memory structure being electrically connected to the first terminal of the transistor; a first bit line, electrically connected to a top electrode of the first phase change memory structure; and a second bit line, electrically connected to a bottom electrode of the second phase change memory structure.

20 Claims, 28 Drawing Sheets

(52) U.S. Cl.
CPC ......... *H10N 70/063* (2023.02); *H10N 70/841* (2023.02); *H10N 70/8613* (2023.02)

(56) References Cited

U.S. PATENT DOCUMENTS

| | | | |
|---|---|---|---|
| 8,223,529 B2* | 7/2012 | Kim | G11C 13/0004 365/158 |
| 10,930,704 B2 | 2/2021 | Huang et al. | |
| 2007/0217254 A1* | 9/2007 | Matsuoka | H10B 63/80 257/E27.071 |
| 2008/0093592 A1 | 4/2008 | Moriya | |
| 2009/0267044 A1* | 10/2009 | Chang | H10B 63/20 365/163 |
| 2010/0142249 A1* | 6/2010 | Choi | G11C 7/18 365/163 |
| 2011/0241225 A1 | 10/2011 | Nagashima et al. | |
| 2013/0015421 A1 | 1/2013 | Sim et al. | |
| 2014/0065789 A1 | 3/2014 | Sasago et al. | |
| 2014/0204661 A1 | 7/2014 | Doyle et al. | |
| 2014/0241050 A1* | 8/2014 | Nakai | G11C 13/0004 365/163 |
| 2016/0042778 A1 | 2/2016 | Manipatruni et al. | |
| 2016/0322090 A1 | 11/2016 | Chan et al. | |
| 2020/0005863 A1 | 1/2020 | Grobis et al. | |
| 2020/0006627 A1 | 1/2020 | Manipatruni et al. | |
| 2020/0335696 A1 | 10/2020 | Fantini et al. | |
| 2022/0069011 A1 | 3/2022 | Ahn et al. | |
| 2023/0154515 A1* | 5/2023 | Wang | H10B 61/22 365/158 |
| 2023/0171969 A1* | 6/2023 | Wang | H10B 61/00 438/3 |

FOREIGN PATENT DOCUMENTS

| | | |
|---|---|---|
| CN | 102931206 A | 2/2013 |
| CN | 104081463 B | 6/2017 |
| CN | 110619908 A | 12/2019 |
| CN | 110943102 A | 3/2020 |
| CN | 112234077 A | 1/2021 |
| JP | 2004220759 A | 8/2004 |
| TW | 200832694 A | 8/2008 |
| WO | 2009084514 A1 | 7/2009 |

OTHER PUBLICATIONS

TW Office Action cited in TW111132089, mailed May 15, 2023, 13 pages.
International Search Report cited in PCT/CN2022/078678 mailed Jun. 22, 2022, 8 pages.
TW Office Action cited in TW111132158, mailed Feb. 7, 2023, 7 pages.

* cited by examiner

US 12,046,280 B2

SEMICONDUCTOR STRUCTURE AND MANUFACTURING METHOD THEREOF

CROSS-REFERENCE TO RELATED APPLICATIONS

The present disclosure is a continuation application of International Patent Application No. PCT/CN2022/099216, filed on Jun. 16, 2022, which claims the priority to Chinese Patent Application 202210538052.9, titled "SEMICONDUCTOR STRUCTURE AND MANUFACTURING METHOD THEREOF" and filed with China National Intellectual Property Administration (CNIPA) on May 18, 2022. The entire contents of International Patent Application No. PCT/CN2022/099216 and Chinese Patent Application 202210538052.9 are incorporated herein by reference.

TECHNICAL FIELD

The present disclosure relates to the technical field of semiconductors, and in particular to a semiconductor structure and a manufacturing method thereof.

BACKGROUND

The phase change random access memory (PCRAM) is an emerging non-volatile memory technology that uses a phase change material as a storage medium to store data based on such a characteristic that the phase change material presents different resistivity during rapid and reversible conversion between a crystalline phase and an amorphous phase under the effect of Joule heat of an electric current.

The most common internal combination of the PCRAM is 1T-1R (i.e., one transistor in series with one resistive memory) cells, which can be arranged in an array. Each cell can be randomly and independently selected.

However, 1T-1R has the disadvantage of small read margin because a reference signal needs to be provided. How to improve the read margin of the PCRAM is an urgent problem to be solved.

SUMMARY

According to some embodiments, an aspect of the present disclosure provides a semiconductor structure, including:
  a transistor;
  a first phase change memory structure, a bottom electrode of the first phase change memory structure being electrically connected to a first terminal of the transistor;
  a second phase change memory structure, a top electrode of the second phase change memory structure being electrically connected to the first terminal of the transistor;
  a first bit line, electrically connected to a top electrode of the first phase change memory structure; and
  a second bit line, electrically connected to a bottom electrode of the second phase change memory structure.

Another aspect of the present disclosure further provides a manufacturing method of a semiconductor structure, including:
  forming a transistor;
  forming a first phase change memory structure, a second phase change memory structure, a first bit line, and a second bit line, where
    a bottom electrode of the first phase change memory structure is electrically connected to a first terminal of the transistor;
    a top electrode of the second phase change memory structure is electrically connected to the first terminal of the transistor;
    the first bit line is electrically connected to a top electrode of the first phase change memory structure; and
    the second bit line is electrically connected to a bottom electrode of the second phase change memory structure.

BRIEF DESCRIPTION OF THE DRAWINGS

To describe the technical solutions in the embodiments of the present disclosure or in the conventional art more clearly, the following briefly describes the accompanying drawings required for describing the embodiments or the conventional art. Apparently, the accompanying drawings in the following description show merely some embodiments of the present disclosure, and a person of ordinary skill in the art may still derive other accompanying drawings from these accompanying drawings without creative efforts.

DETAILED DESCRIPTION

Figure 1:
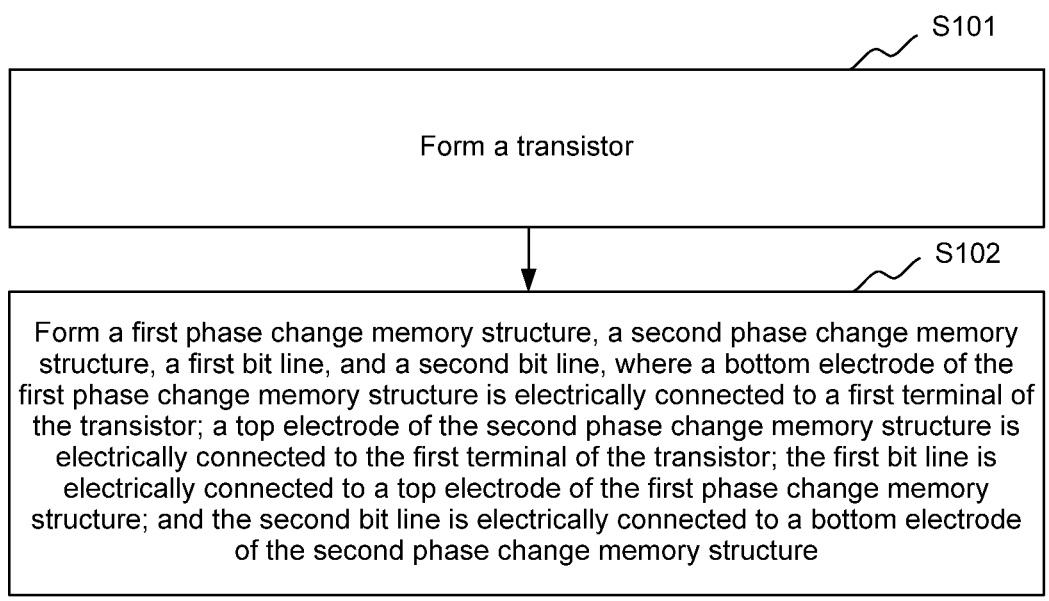
FIG. 1 is a flowchart of a manufacturing method of a semiconductor structure according to an embodiment of the present disclosure.

To facilitate the understanding of the present disclosure, the present disclosure will be described more completely below with reference to the accompanying drawings. Preferred embodiments of the present disclosure are shown in the accompanying drawings. However, the present application may be embodied in various forms without being limited to the embodiments described herein. On the contrary, these embodiments are provided to make the present application more thorough and comprehensive.

Unless otherwise defined, all technical and scientific terms used herein have the same meaning as commonly understood by those skilled in the technical field of the present application. The terms used in the specification of the present disclosure are merely for the purpose of describing specific embodiments, rather than to limit the present disclosure.

It should be understood that when an element or a layer is described as "being on" or "being electrically connected to" another element or layer, it can be on or electrically is connected to the another element or layer directly, or an intervening element or layer may be present. It should be understood that although terms such as first, second, and third may be used to describe various elements, components, regions, layers, doping types and/or sections, these elements, components, regions, layers, doping types and/or sections should not be limited by these terms. These terms are only used to distinguish one element, component, region, layer, doped type or section from another element, component, region, layer, doped type or section. Therefore, without departing from the teachings of the present disclosure, a first element, component, region, layer, doping type or section discussed below may be a second element, component, region, layer, doping type or section. For example, a first phase change memory structure may be a second phase change memory structure, and similarly, the second phase change memory structure may be the first phase change memory structure; or the first phase change memory structure and the second phase change memory structure are different phase change memory structures, for example, the first phase change memory structure may be used as a reference unit and the second phase change memory structure may be used as a data unit, or the first phase change memory structure may be used as a data unit and the second phase change memory structure may be used as a reference unit.

Spatial relationship term such as "located above" can be used herein to describe the relationship shown in the figure between one element or feature and another element or feature. It should be understood that in addition to the orientations shown in the figure, the spatial relationship terms further include different orientations of used and operated devices. For example, if a device in the accompanying drawings is turned over and described as being "located above" another element or feature, the device is oriented "on" the another element or feature. Therefore, the exemplary term "located above" may include two orientations of above and below. In addition, the device may further include other orientations (for example, a rotation by 90 degrees or other orientations), and the spatial description used herein is interpreted accordingly.

In the specification, the singular forms of "a pair" and "the/this" may also include plural forms, unless clearly indicated otherwise. It should also be understood that term "include", when used in this specification, may determine the presence of features, is integers, steps, operations, elements and/or components, but does not exclude the presence or addition of one or more other features, integers, steps, operations, elements, components and/or groups. In this case, in this specification, the term "and/or" includes any and all combinations of related listed items.

Embodiments of the present disclosure are described herein with reference to cross-sectional views as schematic diagrams of idealized embodiments (and intermediate structures) of the present disclosure, such that variations shown in the shapes and due to, for example, manufacturing techniques and/or tolerances can be contemplated. Therefore, the embodiments of the present disclosure should not be limited to the specific shapes of the regions shown herein, but include shape deviations due to, for example, manufacturing technology. The regions shown in the figure are schematic in nature, and their shapes are not intended to show the actual shapes of the regions of the device and do not limit the scope of the present disclosure.

With reference to FIG. 1, according to some embodiments, the present disclosure provides a manufacturing method of a semiconductor structure. The method may specifically include the following steps:

S101: Form a transistor.

S102: Form a first phase change memory structure, a second phase change memory structure, a first bit line, and a second bit line.

The transistor has a first terminal and a second terminal. Each of the first phase change memory structure and the second phase change memory structure has a bottom electrode and a top electrode. Specifically, the bottom electrode of the first phase change memory structure is electrically connected to the first terminal of the transistor; the top electrode of the second phase change memory structure is electrically connected to the first terminal of the transistor; the first bit line is electrically connected to the top electrode of the first phase change memory structure; the second bit line is electrically connected to the bottom electrode of the second phase change memory structure.

In the manufacturing method of a semiconductor structure provided by the present disclosure, two phase change memory structures form a complementary structure, where the first phase change memory structure and the second phase change memory structure is may be constantly configured in complementary states (for example, the first phase change memory structure is in a crystalline phase while the second phase change memory structure is in an amorphous phase, and vice versa), so that the manufactured semiconductor structure does not need any external reference signal, thus achieving a high read speed, a large read margin, and high reliability.

It should be noted that, the present disclosure does not limit the specific type of the transistor. The transistor in the present disclosure may include, but not limited to, a field effect transistor, an insulated gate bipolar transistor, or the like; the first terminal of the transistor may include a source or a drain; in an embodiment, the first terminal of the transistor may include a drain, and the second terminal of the transistor may include a source.

The manufacturing method of a semiconductor structure provided by some embodiments of the present disclosure will be described in further detail below with reference to FIG. 2 to FIG. 17.

Figure 2:
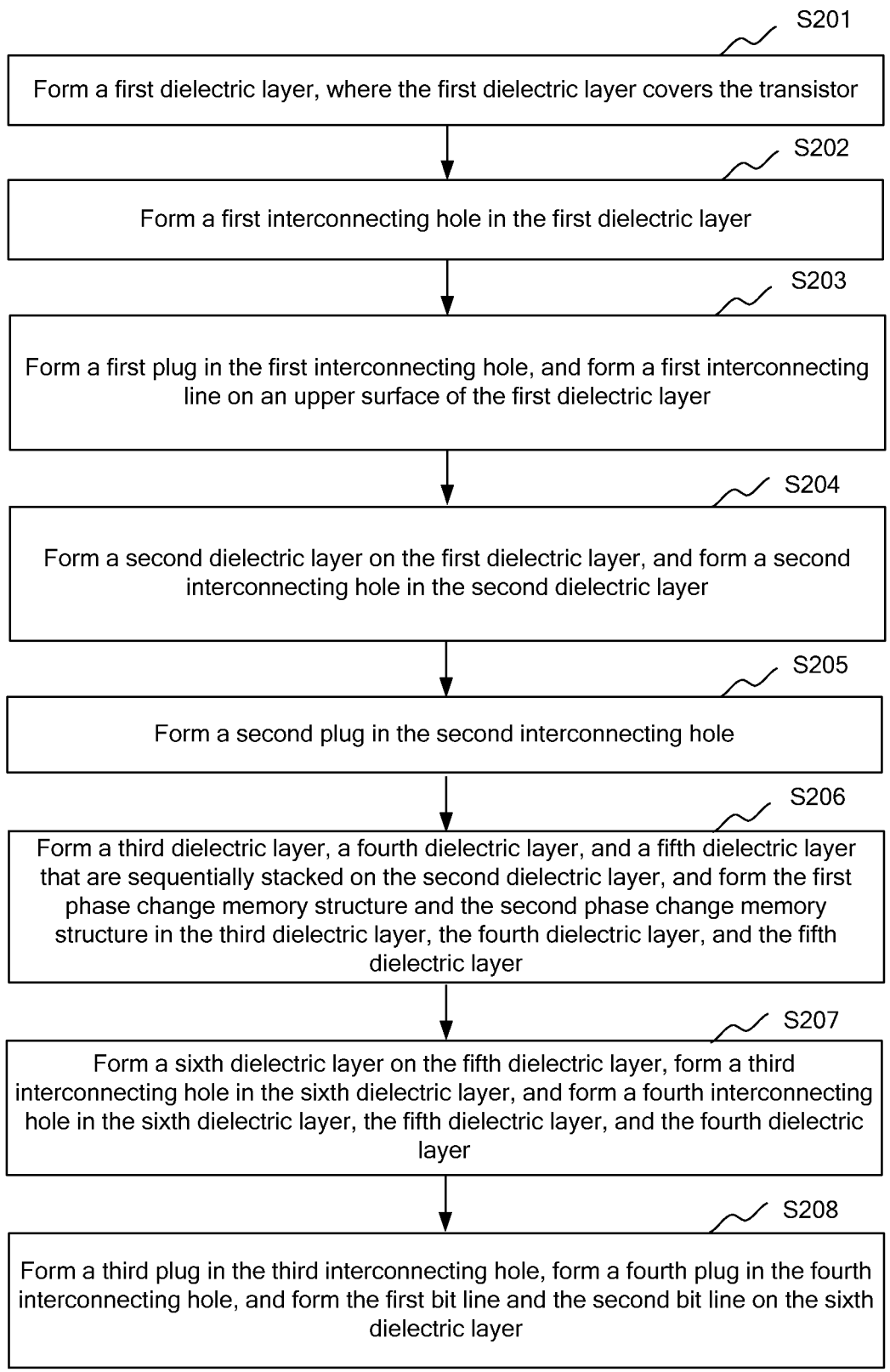
FIG. 2 is a flowchart of step S102 in the manufacturing method of a semiconductor structure according to an embodiment of the present disclosure.
Figure 3:
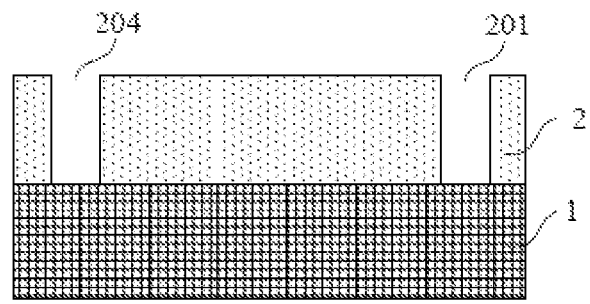
FIG. 3 is a schematic cross-sectional view of a structure obtained in step S202 in the manufacturing method of a semiconductor structure according to an embodiment of the present disclosure.

Referring to FIG. 2, in an embodiment, step S102 may specifically include the following steps:

S201: As shown in FIG. 3, form a first dielectric layer 2, where the first dielectric layer covers the transistor 1.

S202: As shown in FIG. 3, form a first interconnecting hole 201 in the first dielectric layer 2, where the first interconnecting hole 201 exposes a first terminal of the transistor (the first terminal is not shown in FIG. 3).

Figure 4:
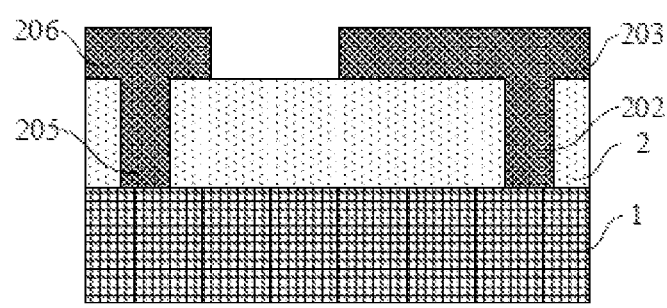
FIG. 4 is a schematic cross-sectional view of a structure obtained in step S203 in the manufacturing method of a semiconductor structure according to an embodiment of the present disclosure.

S203: As shown in FIG. 4, form a first plug 202 in the first interconnecting hole 201, and form a first interconnecting line 203 on an upper surface of the first dielectric layer 2, where the first interconnecting line 203 is connected to the first terminal of the transistor through the first plug 202.

Figure 6:
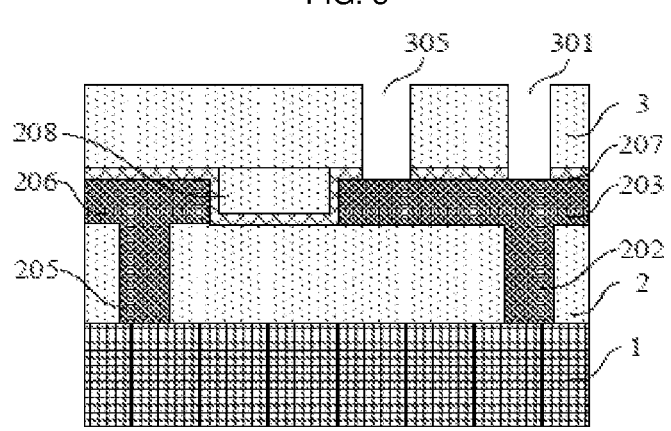
FIG. 6 is a schematic cross-sectional view of a structure obtained in step S204 in the manufacturing method of a semiconductor structure according to an embodiment of the present disclosure.

S204: As shown in FIG. 6, form a second dielectric layer 3 on the first dielectric layer 2, and form a second interconnecting hole 301 in the second dielectric layer 3, where the second interconnecting hole 301 exposes a first interconnecting line 203.

Figure 8:
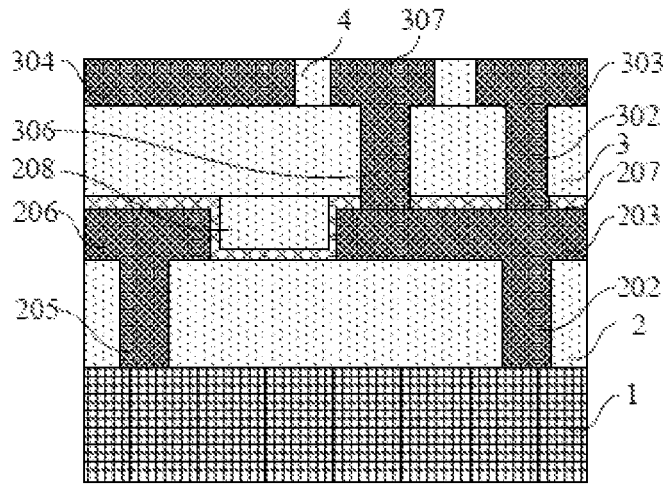
FIG. 8 and FIG. 9 are schematic cross-sectional views of structures obtained in step S301 to step S303 in the manufacturing method of a semiconductor structure according to an embodiment of the present disclosure.

S205: As shown in FIG. 8, form a second plug 302 in the second interconnecting hole 301.

S206: As shown in FIG. 8 to FIG. 15, form a third dielectric layer 4, a fourth dielectric layer 5, and a fifth dielectric layer 6 that are sequentially stacked on the second dielectric layer 3, and form the first phase change memory structure 520 and the second phase change memory structure (not marked in the figure) in the third dielectric layer 4, the fourth dielectric layer 5, and the fifth dielectric layer 6, where a bottom electrode 303 of the first phase change memory structure is connected to the first interconnecting line 203 through the second plug 302, and a top electrode 505 of the second phase change memory structure is electrically connected to the first interconnecting line 203.

Figure 16:
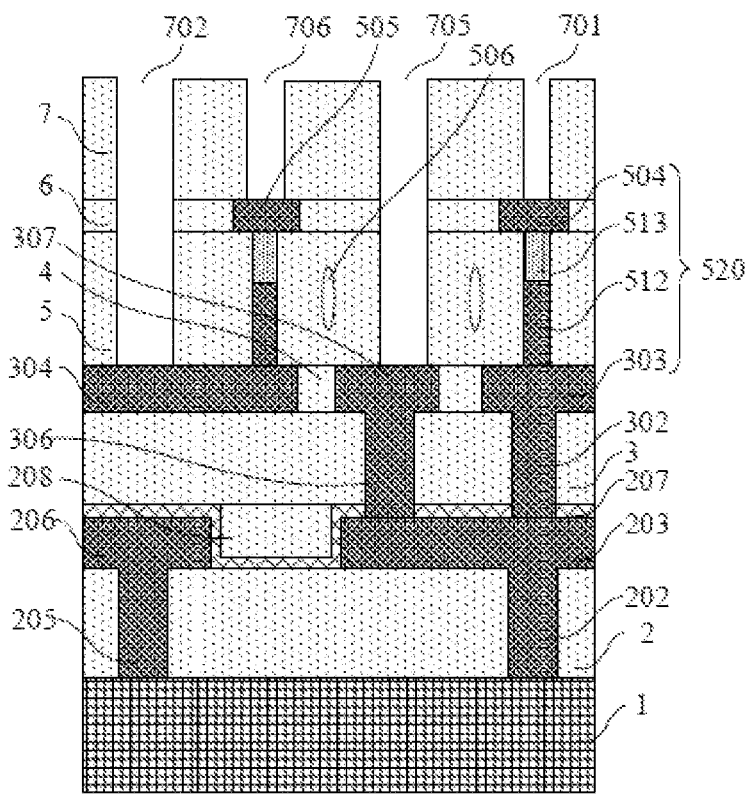
FIG. 16 is a schematic cross-sectional view of a structure obtained in step S207 in the manufacturing method of a semiconductor structure according to an embodiment of the present disclosure.

S207: As shown in FIG. 16, form a sixth dielectric layer 7 on the fifth dielectric layer 6, form a third interconnecting hole 701 in the sixth dielectric layer 7, and form a fourth interconnecting hole 702 in the sixth dielectric layer 7, the fifth dielectric layer 6, and the fourth dielectric layer 5, where the third interconnecting hole 701 exposes a top electrode of the first phase change memory structure, and the fourth interconnecting hole 702 exposes a bottom electrode 304 of the second phase change memory structure.

Figure 17:
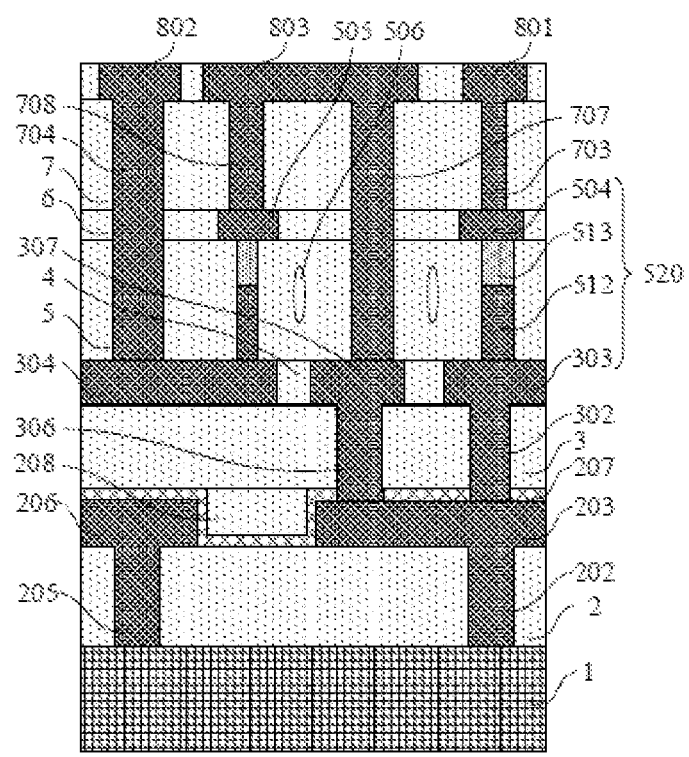
FIG. 17 is a schematic cross-sectional view of a structure obtained in step S208 in the manufacturing method of a semiconductor structure according to an embodiment of the present disclosure, that is, a schematic cross-sectional view of a semiconductor structure according to an embodiment of the present disclosure.

S208: As shown in FIG. 17, form a third plug 703 in the third interconnecting hole (not shown in FIG. 17), form a fourth plug 704 in the fourth interconnecting hole 702, and form a first bit line 801 and a second bit line 802 on the sixth dielectric layer 7, where the first bit line 801 is electrically connected to the top electrode 504 of the first phase change memory structure through the third plug 703, and the second bit line 802 is electrically connected to the bottom electrode 304 of the second phase change memory structure through the fourth plug 704.

Figure 7:
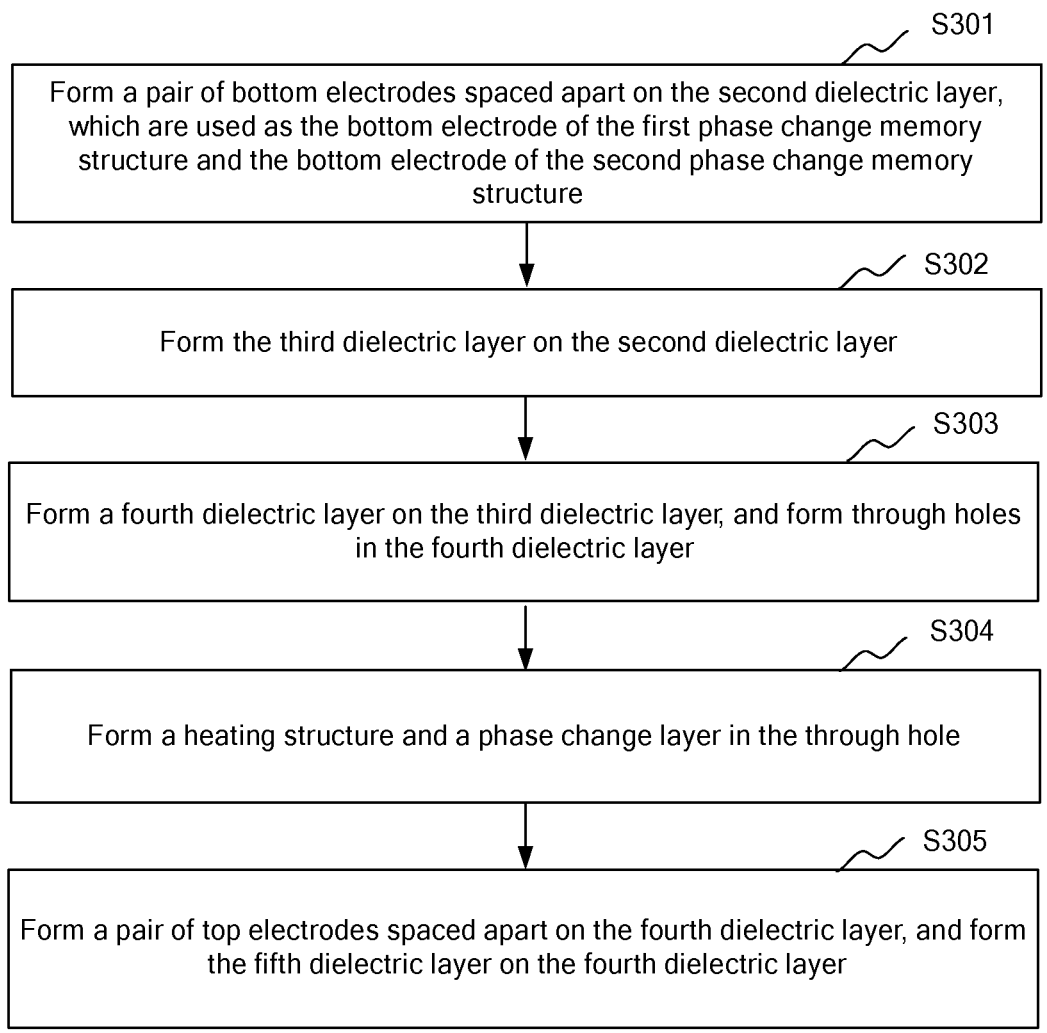
FIG. 7 is a schematic cross-sectional view of a structure obtained in step S206 in the manufacturing method of a semiconductor structure according to an embodiment of the present disclosure.

For step S206, referring to FIG. 8 to FIG. 15 in conjunction with FIG. 7, in an embodiment, step S206 may specifically include the following steps:

S301: As shown in FIG. 8, form a pair of bottom electrodes spaced apart on the second dielectric layer 3, which are used as the bottom electrode 303 of the first phase change memory structure and the bottom electrode 304 of the second phase change memory structure.

S302: As shown in FIG. 8, form the third dielectric layer 4 on the second dielectric layer 3, where both the bottom electrode 303 of the first phase change memory structure and the bottom electrode 304 of the second phase change memory structure are located in the third dielectric layer 4.

In an embodiment, a bottom electrode material layer may be formed on the second dielectric layer, and then the bottom electrode material layer is patterned to form a third dielectric layer groove and the bottom electrode; a third dielectric layer material layer is filled in the third dielectric layer groove to form the third dielectric layer. Alternatively, a third dielectric layer material layer may be first formed on the second dielectric layer, and then the third dielectric layer material layer is patterned to form a bottom electrode groove and the third dielectric layer; and a bottom electrode material layer is filled in the bottom electrode groove to form the bottom electrode.

Figure 9:
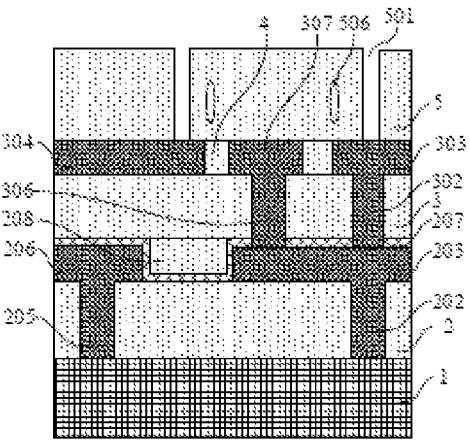

S303: As shown in FIG. 9, form a fourth dielectric layer 5 on the third dielectric layer 4, where the fourth dielectric layer 5 covers the bottom electrodes; form through holes in the fourth dielectric layer 5, where the through holes 501 correspond to the bottom electrodes in a one-to-one manner, and expose the bottom electrodes; and form an air gap 506 in the fourth dielectric layer 5, where the air gap 506 is located between the through holes 501.

S304: As shown in FIG. 11 to FIG. 14, form a heating structure 512 and a phase change layer 513 in each of the through holes 501.

Figure 15:
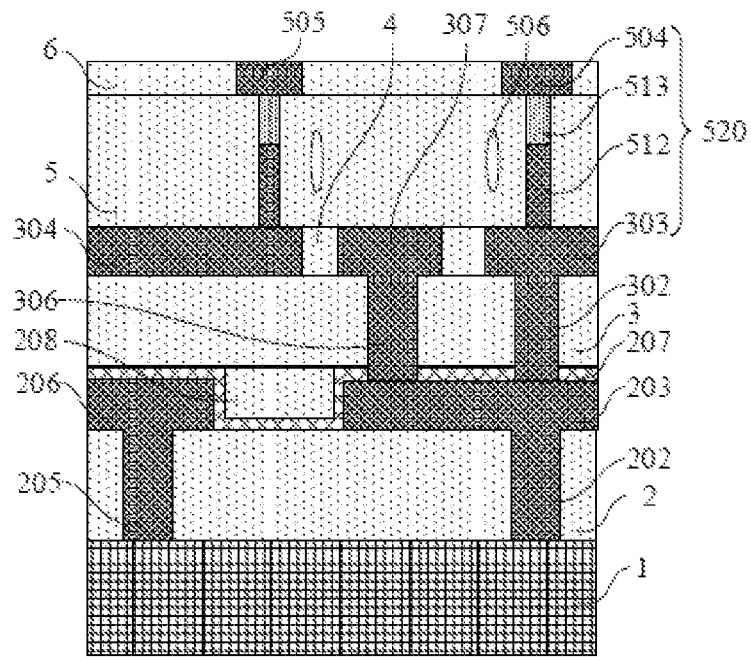
FIG. 15 is a schematic cross-sectional view of a structure obtained in step S305 in the manufacturing method of a semiconductor structure according to an embodiment of the present disclosure.

S305: As shown in FIG. 15, form a pair of top electrodes spaced apart on the fourth dielectric layer 5, which are used as the top electrode 504 of the first phase change memory structure and the top electrode 505 of the second phase change memory structure, where the top electrodes are in contact with the phase change layers 513; and form the fifth dielectric layer 6 on the fourth dielectric layer 5, where the fifth dielectric layer 6 covers a surface of an exposed portion of the fourth dielectric layer 5.

In the manufacturing method of a semiconductor structure provided by the foregoing embodiment, an air gap is formed in the fourth dielectric layer 5, and the air gap is located between the through holes, which can reduce the parasitic capacitance between the first phase change memory structure and the second phase change memory structure.

It may be understood that, in the manufacturing method of a semiconductor structure provided by the present disclosure, the bottom electrodes in step S303 include the bottom electrode 303 of the first phase change memory structure and the bottom electrode 304 of the second phase change memory structure.

The present disclosure does not limit the specific manner of forming the air gap 506 in the fourth dielectric layer 5, which may include, but not limited to, forming an opening in the fourth dielectric layer 5, depositing a fourth dielectric material layer in the opening, and forming the air gap 506 in the fourth dielectric layer 5 by controlling a deposition speed of the fourth dielectric material layer.

In an embodiment, a width of the through hole 501 may be 10 nm to 20 nm, and specifically may be 10 nm, 12 nm, 15 nm, 18 nm or 20 nm. It should be noted that, the foregoing data is merely an example, and in an actual embodiment, the width of the through hole 501 is not limited to the foregoing data.

Based on the foregoing embodiment, widths of the heating structure 512 and the phase change layer 513 may also be 10 nm to 20 nm, and specifically may be 10 nm, 12 nm, 15 nm, 18 nm or 20 nm. It should be noted that, the foregoing data is merely an example, and in an actual embodiment, the widths of the heating structure 512 and the phase change layer 513 are not limited to the foregoing data.

It should be noted that, the present disclosure does not specifically limit a height of the top of the air gap 506. In another possible embodiment, the top of the air gap 506 may be higher than a lower surface of the top electrode 504 of the first phase change memory structure and a lower surface of the top electrode 505 of the second phase change memory structure. Based on the foregoing embodiment, the air gap 506 may be formed in the fourth dielectric layer 5 and the fifth dielectric layer 6.

Figure 10:
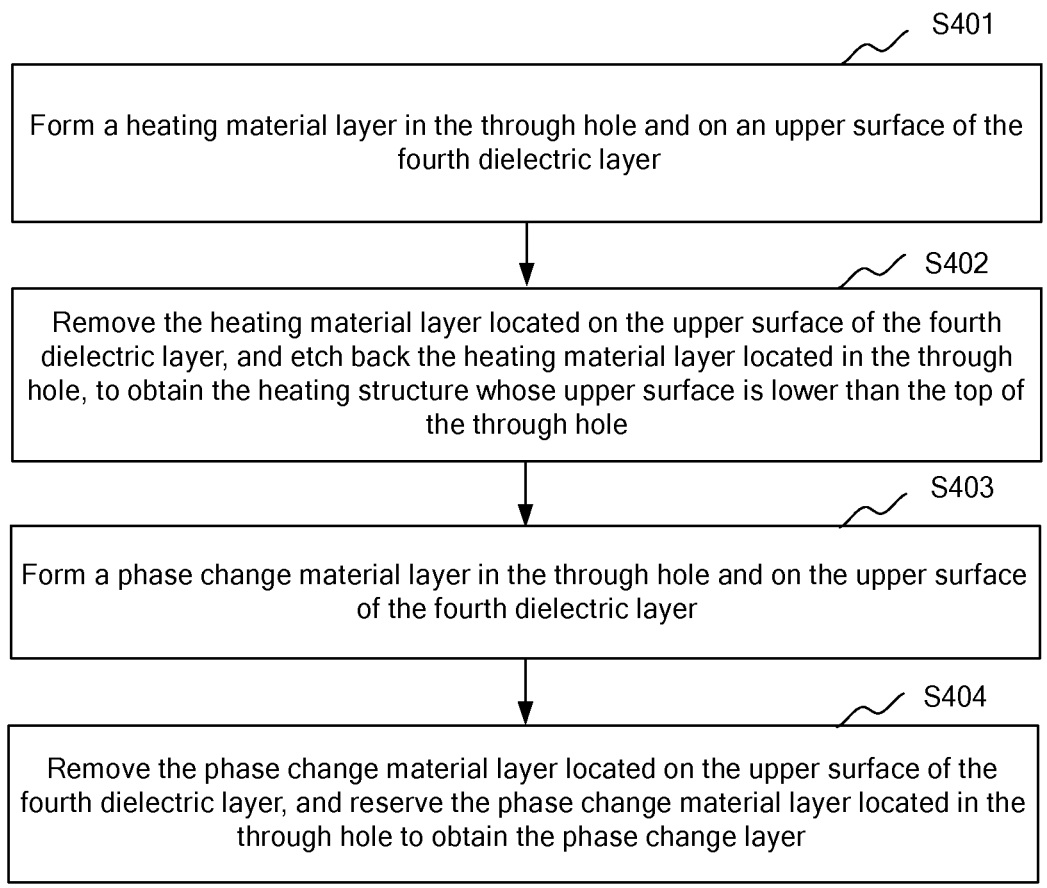
FIG. 10 is a flowchart of step S304 in the manufacturing method of a semiconductor structure according to an embodiment of the present disclosure.
Figure 11:
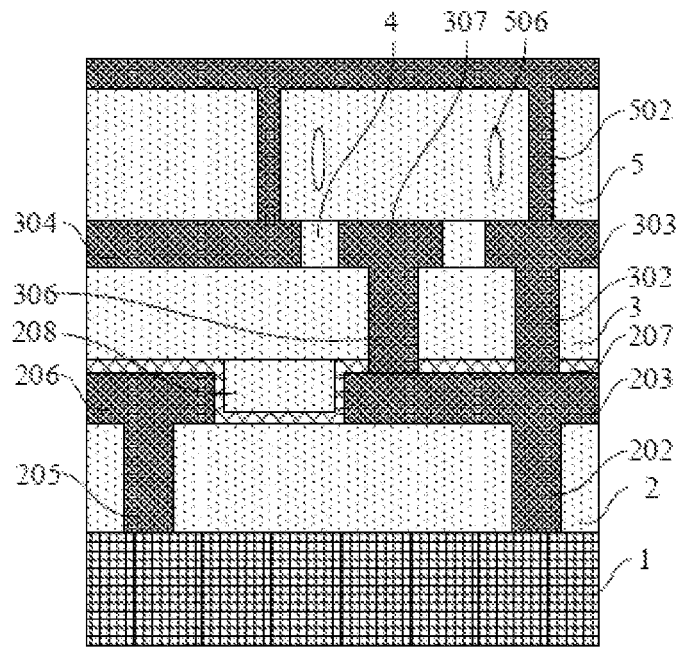
FIG. 11 to FIG. 14 are schematic cross-sectional views of structures obtained in step S401 to step S404 in the manufacturing method of a semiconductor structure according to an embodiment of the present disclosure.

For step S304, referring to FIG. 11 to FIG. 14 in conjunction with FIG. 10, in an embodiment, step S304 may specifically include the following steps:

S401: As shown in FIG. 11, form a heating material layer 502 in the through hole 501 and on an upper surface of the fourth dielectric layer 5.

Figure 12:
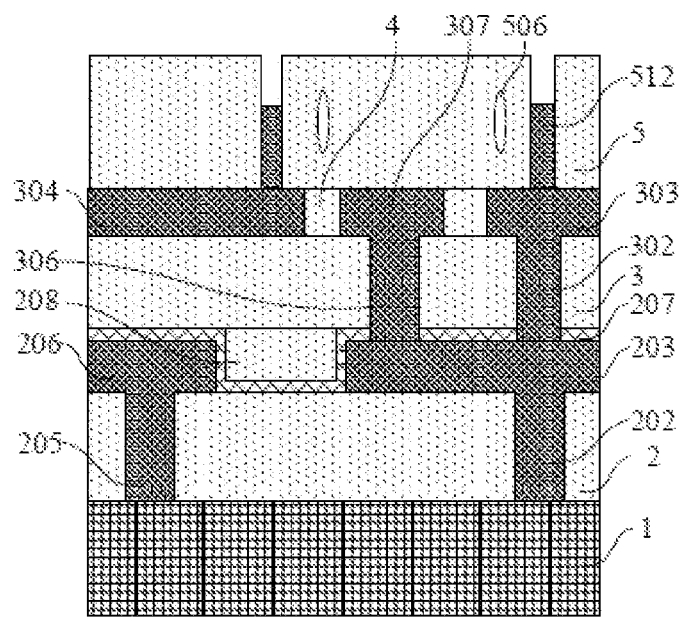

S402: As shown in FIG. 12, remove the heating material layer 502 located on the upper surface of the fourth dielectric layer 5, and etch back the heating material layer 502 located in the through hole 501, to obtain the heating structure 512 whose upper surface is lower than the top of the through hole 501.

Figure 13:
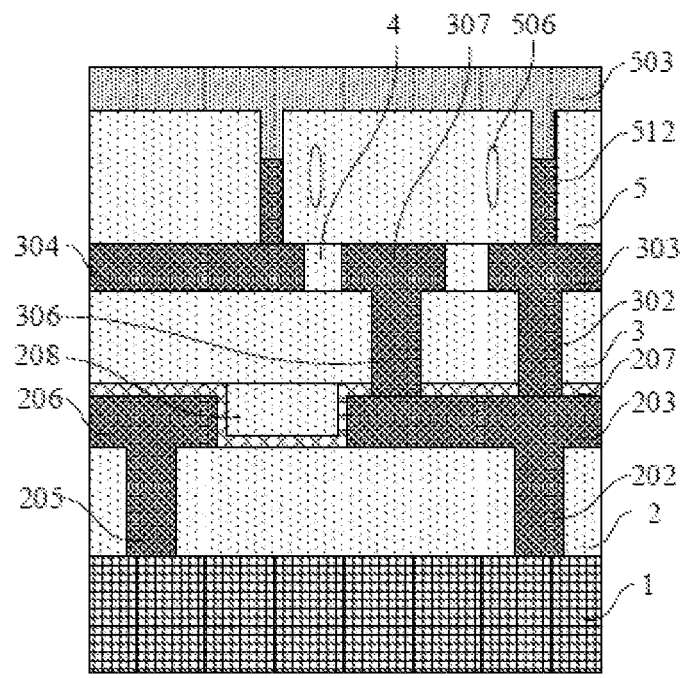

S403: As shown in FIG. 13, form a phase change material layer 503 in the through is hole 501 and on the upper surface of the fourth dielectric layer 5.

Figure 14:
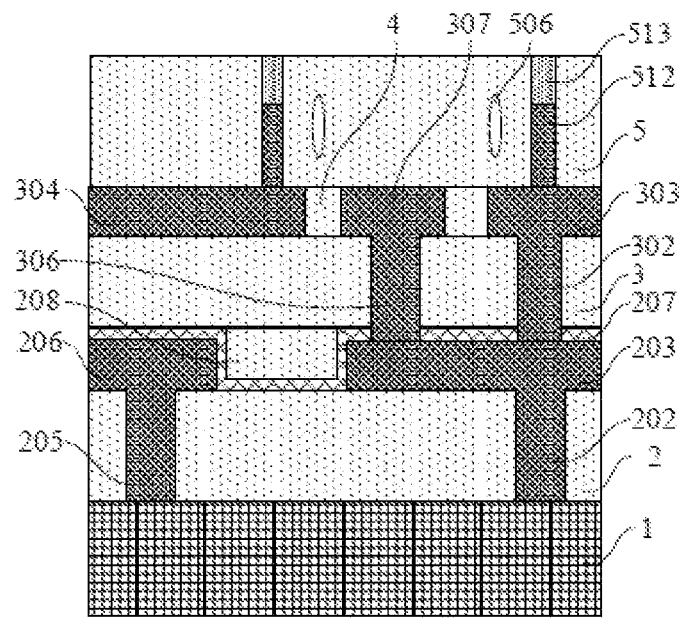

S404: As shown in FIG. 14, remove the phase change material layer 503 located on the upper surface of the fourth dielectric layer 5, and reserve the phase change material layer 503 located in the through hole 501 to obtain the phase change layer 513.

Further referring to FIG. 6, in an embodiment, while the second interconnecting hole is formed in the second dielectric layer 3 in step S204, the method may further include a step of simultaneously forming a fifth interconnecting hole 305 in the second dielectric layer 3.

Based on the foregoing step, further referring to FIG. 8, while the second plug 302 is formed in the second interconnecting hole 301 in step S205, the method may further include a step of simultaneously forming a fifth plug 306 in the fifth interconnecting hole 305.

Based on the foregoing step, further referring to FIG. 8, while a pair of bottom electrodes spaced apart are formed on the second dielectric layer 3 in step S206, the method may further include a step of forming a second interconnecting line 307 between the bottom electrodes, where a gap exists between the second interconnecting line 307 and the bottom electrode, and the gap between the second interconnecting line 307 and the bottom electrode is filled with the third dielectric layer 4.

Based on the foregoing step, further referring to FIG. 16, while the fourth interconnecting hole 702 is formed in the sixth dielectric layer 7, the fifth dielectric layer 6, and the fourth dielectric layer 5 in step S207, the method may further include a step of forming a sixth interconnecting hole 705 in the sixth dielectric layer 7, the fifth dielectric layer 6, and the fourth dielectric layer 5, and forming a seventh interconnecting hole 706 in the sixth dielectric layer 7, where the sixth interconnecting hole 705 exposes the second interconnecting line 307, and the seventh interconnecting hole 706 exposes the top electrode 505 of the second phase change memory structure.

Based on the foregoing step, further referring to FIG. 17, while the third plug 703 is formed in the third interconnecting hole 701 and the fourth plug 704 is formed in the fourth interconnecting hole 702 in step S208, the method may further include a step of forming a sixth plug 707 in the sixth interconnecting hole 705 and forming a seventh plug 708 in is the seventh interconnecting hole 706; while the first bit line 801 and the second bit line are formed on the sixth dielectric layer 7 in step S208, the method may further include a step of forming a third interconnecting line 803 on the sixth dielectric layer 7.

In an embodiment, as shown in FIG. 3, while the first interconnecting hole 201 is formed in the first dielectric layer 2 in step S202, the method may further include a step of forming an eighth interconnecting hole 204 in the first dielectric layer 2; specifically, the eighth interconnecting hole 204 may expose the second terminal (not shown in FIG. 3) of the transistor 1.

Based on the foregoing step, as shown in FIG. 4, while the first plug 202 is formed in the first interconnecting hole 201 in step S203, the method may further include a step of forming an eighth plug 205 in the eighth interconnecting hole 204. While the first interconnecting line 203 is formed on the upper surface of the first dielectric layer 2 in step S202, the method may further include a step of forming a control line 206 on the upper surface of the first dielectric layer 2. Specifically, a gap may exist between the control line 206 and the first interconnecting line 203.

Optionally, in an embodiment, after step S204 of forming a first interconnecting line and before step S204 of forming a second dielectric layer 3, the method may further include a step of forming an etching stop layer 207 on the first interconnecting line 203 and an exposed portion of the first dielectric layer 2. Optionally, in an embodiment, the method includes a step of forming a control line 206 on the upper surface of the first dielectric layer 2. Based on the foregoing step, as shown in FIG. 5, after the formation of the first interconnecting line 203 and the control line 206 and before step S204 of forming a second dielectric layer 3, the method may further include a step of forming an etching stop layer 207 on the first interconnecting line 203, the control line 206, and an exposed portion of the first dielectric layer 2.

It should be noted that, the present disclosure does not limit the specific material of the etching stop layer 207. The material of the etching stop layer 207 may include, but is not limited to, silicon, silicon carbide, silicon nitride (SiN) or silicon oxynitride (SiON), etc. In an embodiment, the material of the etching stop layer 207 includes silicon nitride.

Figure 5:
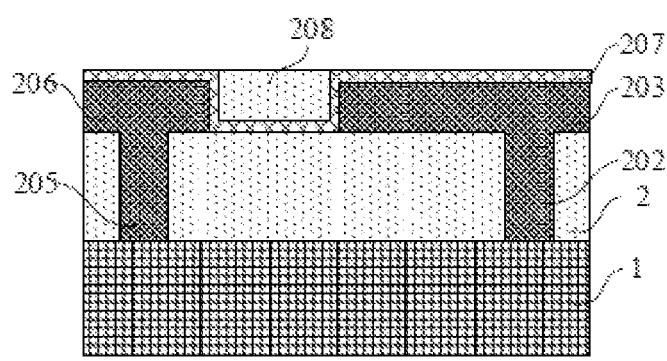
FIG. 5 is a schematic cross-sectional view of a structure obtained in a step of forming an etching stop layer on a first interconnecting line, a control line, and an exposed portion of a first dielectric layer; and forming a dielectric filler layer on an upper surface of the etching stop layer between the first interconnecting line and the control line after the first interconnecting line and the control line are formed and before a second dielectric layer is formed, in the manufacturing method of a semiconductor structure according to an embodiment of the present disclosure.

Further referring to FIG. 5, in an embodiment, after the formation of the etching stop is layer 207 and before the formation of the second dielectric layer 3, the method may further include the following step:

Form a dielectric filler layer 208 on an upper surface of the etching stop layer 207 between the first interconnecting line 203 and the control line 206. Specifically, the gap between the first interconnecting line 203 and the control line 206 is filled with the dielectric filler layer 208.

It should be noted that, the present disclosure does not limit the specific manners of forming the first dielectric layer 2, forming the second dielectric layer 3, forming the sequentially stacked third dielectric layer 4, fourth dielectric layer 5, and fifth dielectric layer 6, and forming the sixth dielectric layer 7 and the dielectric filler layer 208. The first dielectric layer 2, the second dielectric layer 3, the third dielectric layer 4, the fourth dielectric layer 5, the fifth dielectric layer 6, the sixth dielectric layer 7, and the dielectric filler layer 208 may be formed in, but not limited to, the following deposition manners: atmospheric pressure chemical vapor deposition (APCVD), low pressure chemical vapor deposition (LPCVD), plasma-enhanced chemical vapor deposition (PECVD), high-density plasma chemical vapor deposition (HDP-CVD), radical-enhanced chemical vapor deposition (RECVD), atomic layer deposition (ALD), and the like.

It may be understood that, the present disclosure does not limit the specific materials of the first dielectric layer 2, the second dielectric layer 3, the third dielectric layer 4, the fourth dielectric layer 5, the fifth dielectric layer 6, the sixth dielectric layer 7, and the dielectric filler layer 208. The first dielectric layer 2, the second dielectric layer 3, the third dielectric layer 4, the fourth dielectric layer 5, the fifth dielectric layer 6, the sixth dielectric layer 7, and the dielectric filler layer 208 each may include, but not limited to, silicon, silicon nitride (SiN), silicon oxide ($SiO_2$) or silicon oxynitride (SiON), etc. In an embodiment, the first dielectric layer 2, the second dielectric layer 3, the third dielectric layer 4, the fourth dielectric layer 5, the fifth dielectric layer 6, the sixth dielectric layer 7, and the dielectric filler layer 208 each include silicon nitride.

In an embodiment, while the first interconnecting hole 201 and the eighth interconnecting hole 204 are formed in the first dielectric layer 2, the method may further include a step of forming a ninth interconnecting hole in the first dielectric layer 2. Specifically, the ninth interconnecting hole may expose the control terminal of the transistor 1.

Based on the foregoing step, while the first plug 202 is formed in the first interconnecting hole 201 and the eighth plug 205 is formed in the eighth interconnecting hole 204, the method may further include a step of forming a ninth lead-out structure in the ninth interconnecting hole.

It should be noted that, the present disclosure does not limit the specific materials of the first plug 202, the second plug 302, the third plug 703, the fourth plug 704, the fifth plug 306, the sixth plug 707, the seventh plug 708, the eighth plug 205, a ninth plug 901, the first interconnecting line 203, the second interconnecting line 307, and the third interconnecting line 803. These plugs and interconnecting lines may specifically include, but not limited to, metal materials such as copper or tungsten. In an embodiment, the first plug 202, the second plug 302, the third plug 703, the fourth plug 704, the fifth plug 306, the sixth plug 707, the seventh plug 708, the eighth plug 205, the ninth plug 901, the first interconnecting line 203, the second interconnecting line 307, and the third interconnecting line 803 each include tungsten, which can uniformly fill through holes with high depth-to-width ratios, and has a high melting point, high hardness, excellent corrosion resistance, and good electrical and thermal conductivity.

According to some optional embodiments, the present disclosure may further provide a manufacturing method of a semiconductor structure. Referring to FIG. 3 to FIG. 43, a semiconductor structure manufactured by the manufacturing method of a semiconductor structure may include: a transistor 1; a first phase change memory structure 520, a bottom electrode 303 of the first phase change memory structure being electrically connected to a first terminal of the transistor 1; a second phase change memory structure 521, a top electrode 505 of the second phase change memory structure being electrically connected to the first terminal of the transistor 1; a first bit line 801, electrically connected to a top electrode 504 of the first phase change memory structure; and a second bit line 802, electrically connected to a bottom electrode 304 of the second phase change memory structure.

Specifically, the first phase change memory structure 520 may include a bottom electrode 303, a heating structure 512, a phase change layer 513, and a top electrode that are sequentially stacked from bottom to top; the second phase change memory structure 521 may include a top electrode 505, a phase change layer 513, a heating structure 512, and a bottom electrode 304 that are sequentially stacked from bottom to top; the bottom electrode 304 of the second phase change memory structure may be higher than the top electrode 504 of the first phase change memory structure.

More specifically, the top electrode 505 of the second phase change memory structure may be directly connected to a second interconnecting line 307 through a ninth plug 901. In other words, in this case, the top electrode 505 of the second phase change memory structure may be connected to a first interconnecting line 203 through the ninth plug 901, the second interconnecting line 307, and a fifth plug 306 in sequence.

In other words, the electrical connection between the top electrode 505 of the second phase change memory structure and the first interconnecting line 203 may be implemented in other manners. With reference to FIG. 3 to FIG. 30, the electrical connection between the top electrode 505 of the second phase change memory structure and the first interconnecting line 203 implemented in other manners is described in detail below.

Figure 18:
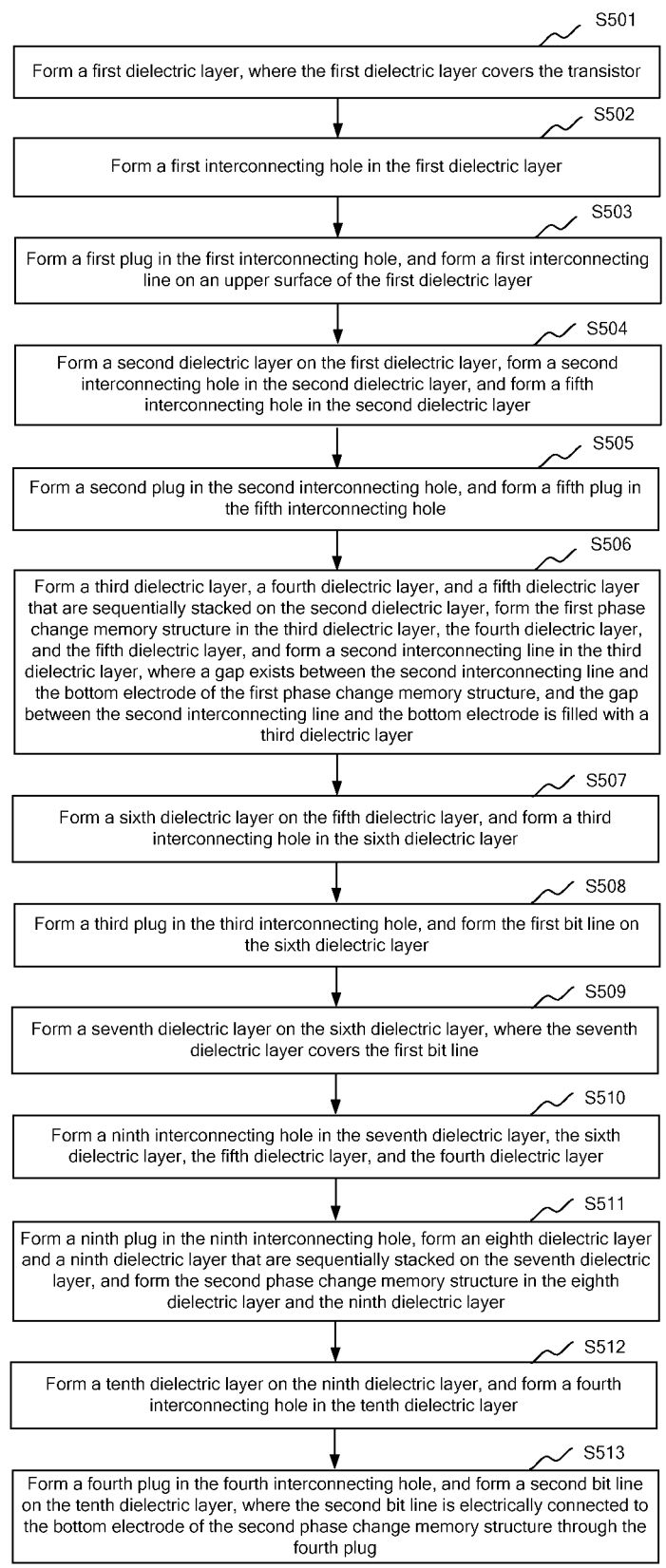
FIG. 18 is a flowchart of step S102 in the manufacturing method of a semiconductor structure according to another embodiment of the present disclosure.

Referring to FIG. 3 to FIG. 30 in combination with FIG. 18, in an embodiment, step S102 may specifically include the following steps:

S501: As shown in FIG. 3, form a first dielectric layer 2, where the first dielectric layer covers the transistor 1.

S502: As shown in FIG. 3, form a first interconnecting hole 201 in the first dielectric layer 2, where the first interconnecting hole 201 exposes a first terminal of the transistor (the first terminal is not shown in FIG. 3).

S503: As shown in FIG. 4, form a first plug 202 in the first interconnecting hole 201, and form a first interconnecting line 203 on an upper surface of the first dielectric layer 2, where the first interconnecting line 203 is connected to the first terminal of the transistor through the first plug 202.

S504: As shown in FIG. 6, form a second dielectric layer 3 on the first dielectric layer 2, and form a second interconnecting hole 301 in the second dielectric layer 3, where the second interconnecting hole 301 exposes the first interconnecting line 203; and simultaneously, form a fifth interconnecting hole 305 in the second dielectric layer 3.

Figure 19:
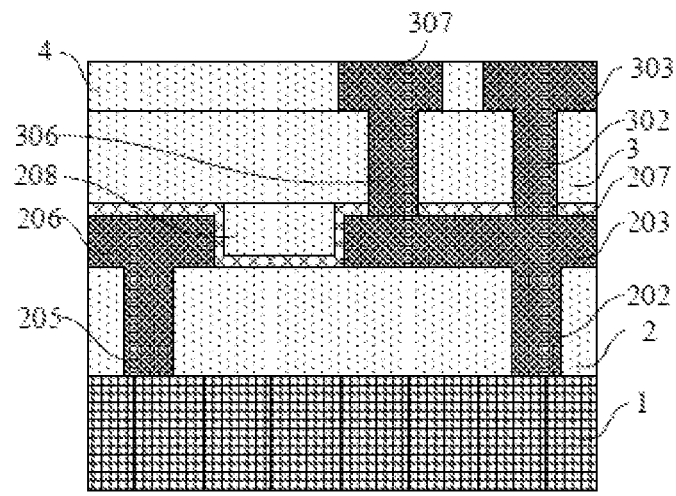
FIG. 19 is a schematic cross-sectional view of a structure obtained in step S505 in the manufacturing method of a semiconductor structure according to another embodiment of the present disclosure.

S505: As shown in FIG. 19, form a second plug 302 in the second interconnecting hole 301, and simultaneously, form a fifth plug 306 in the fifth interconnecting hole 305.

Figure 20:
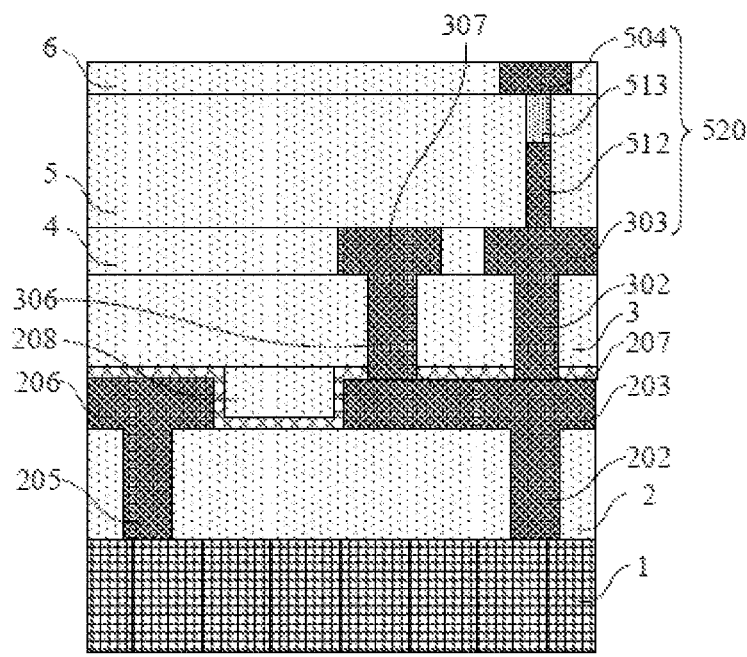
FIG. 20 is a schematic cross-sectional view of a structure obtained in step S506 in the manufacturing method of a semiconductor structure according to another embodiment of the present disclosure.

S506: As shown in FIG. 19 and FIG. 20, form a third dielectric layer 4, a fourth dielectric layer 5, and a fifth dielectric layer 6 that are sequentially stacked on the second dielectric layer 3, form the first phase change memory structure 520 in the third dielectric layer 4, the fourth dielectric layer 5, and the fifth dielectric layer 6, where a bottom electrode 303 of the first phase change memory structure 520 is connected to the first interconnecting line 203 through the second plug 302; simultaneously, form a second interconnecting line 307 in the third dielectric layer 4, where a gap exists between the second interconnecting line 307 and the bottom electrode 303 of the first phase change memory structure 520, and the gap between the second interconnecting line 307 and the bottom electrode 303 of the first phase change memory structure 520 is filled with a third dielectric layer 4.

Figure 21:
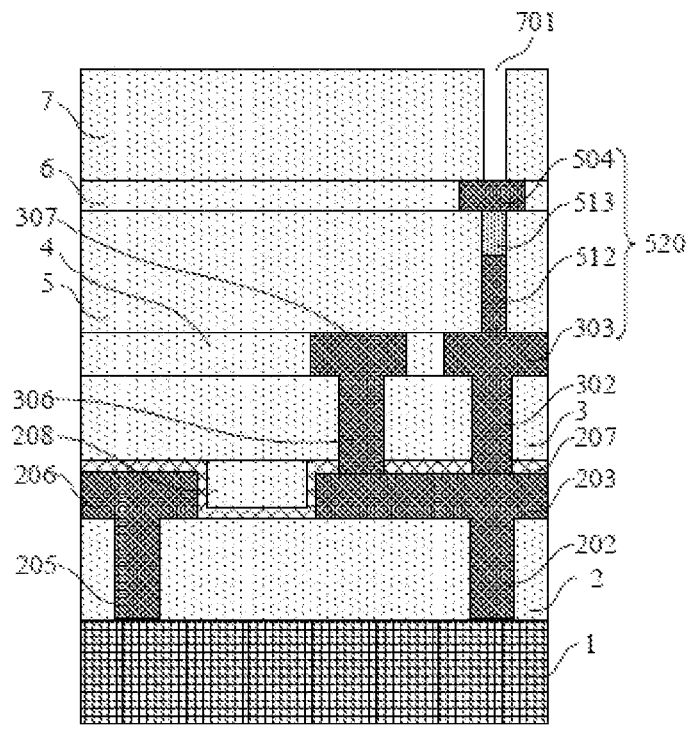
FIG. 21 is a schematic cross-sectional view of a structure obtained in step S507 in the manufacturing method of a semiconductor structure according to another embodiment of the present disclosure.

S507: As shown in FIG. 21, form a sixth dielectric layer 7 on the fifth dielectric layer 6, and form a third interconnecting hole 701 in the sixth dielectric layer 7, where the third interconnecting hole 701 exposes a top electrode 504 of the first phase change memory structure 520.

Figure 22:
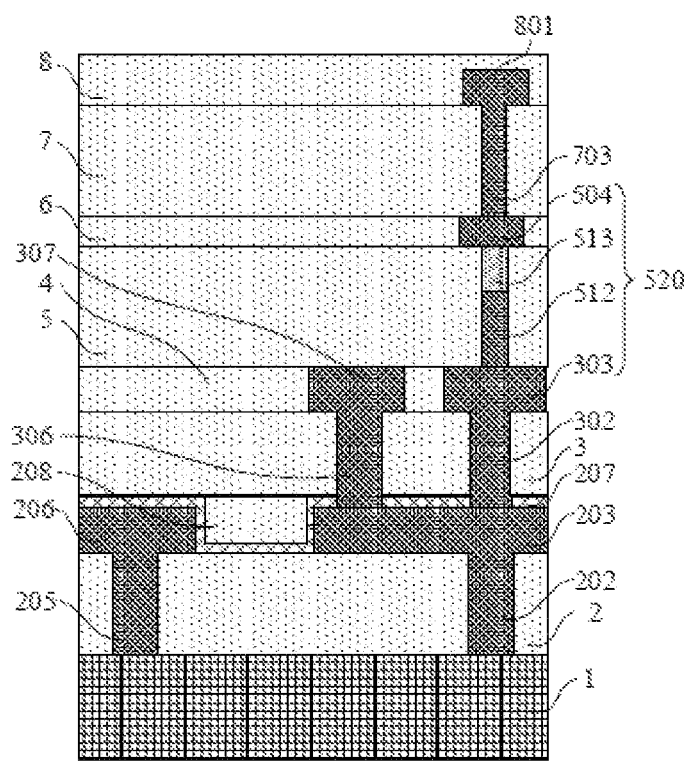
FIG. 22 is a schematic cross-sectional view of a structure obtained in step S509 in the manufacturing method of a semiconductor structure according to another embodiment of the present disclosure.

S508: As shown in FIG. 22, form a third plug 703 in the third interconnecting hole 701, and form the first bit line 801 on the sixth dielectric layer 7, where the first bit line is connected to the top electrode 504 of the first phase change memory structure 520 through the third plug 703.

S509: As shown in FIG. 22, form a seventh dielectric layer 8 on the sixth dielectric layer 7, where the seventh dielectric layer 8 covers the first bit line 801.

Figure 23:
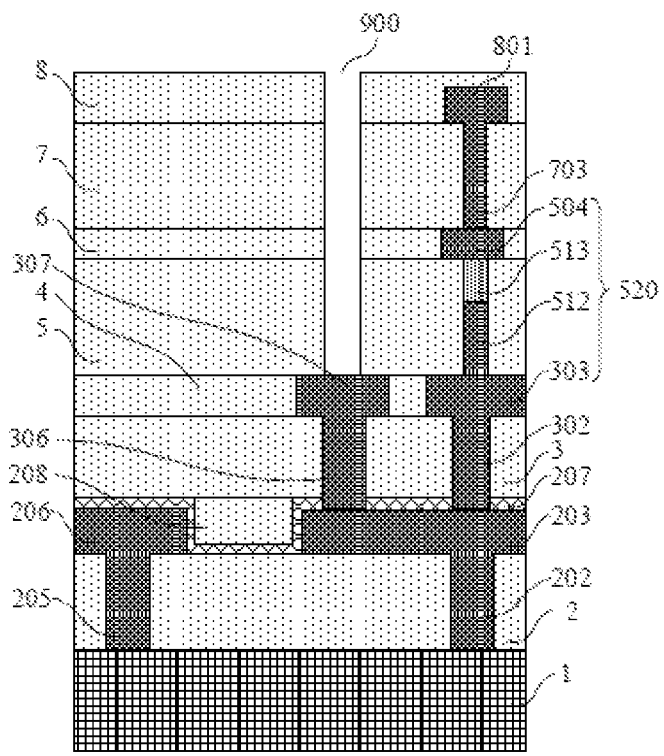
FIG. 23 is a schematic cross-sectional view of a structure obtained in step S510 in the manufacturing method of a semiconductor structure according to another embodiment of the present disclosure.

S510: As shown in FIG. 23, form a ninth interconnecting hole 900 in the seventh dielectric layer 8, the sixth dielectric layer 7, the fifth dielectric layer 6, and the fourth dielectric layer 5, where the ninth interconnecting hole 900 exposes the second interconnecting line 307.

S511: As shown in FIG. 24 to FIG. 32, form a ninth plug 901 in the ninth is interconnecting hole 900, form an eighth dielectric layer 9 and a ninth dielectric layer 10 that are sequentially stacked on the seventh dielectric layer 8, and form the second phase change memory structure 521 in the eighth dielectric layer 9 and the ninth dielectric layer 10, where a top electrode 505 of the second phase change memory structure 521 is connected to the second interconnecting line 307 through the ninth plug 901.

Figure 32:
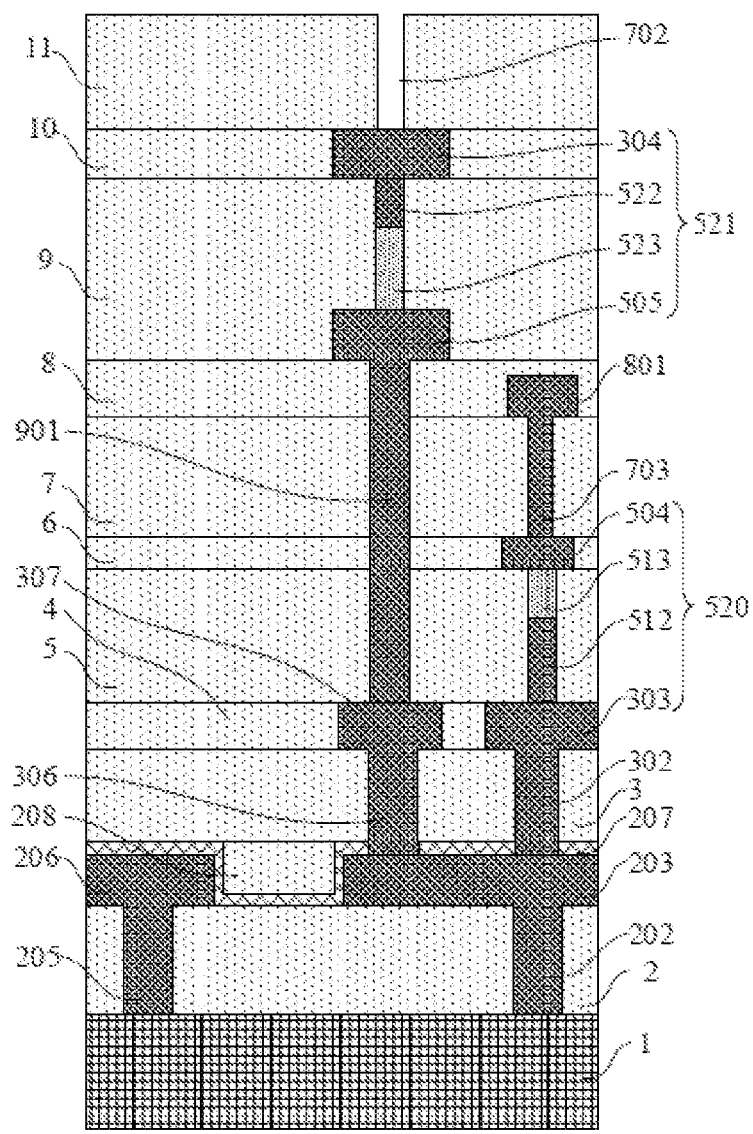
FIG. 32 is a schematic cross-sectional view of a structure obtained in step S512 in the manufacturing method of a semiconductor structure according to another embodiment of the present disclosure.

S512: As shown in FIG. 32, form a tenth dielectric layer 11 on the ninth dielectric layer 10, and form a fourth interconnecting hole 702 in the tenth dielectric layer 11, where the fourth interconnecting hole 702 exposes a bottom electrode 304 of the second phase change memory structure 521.

Figure 33:
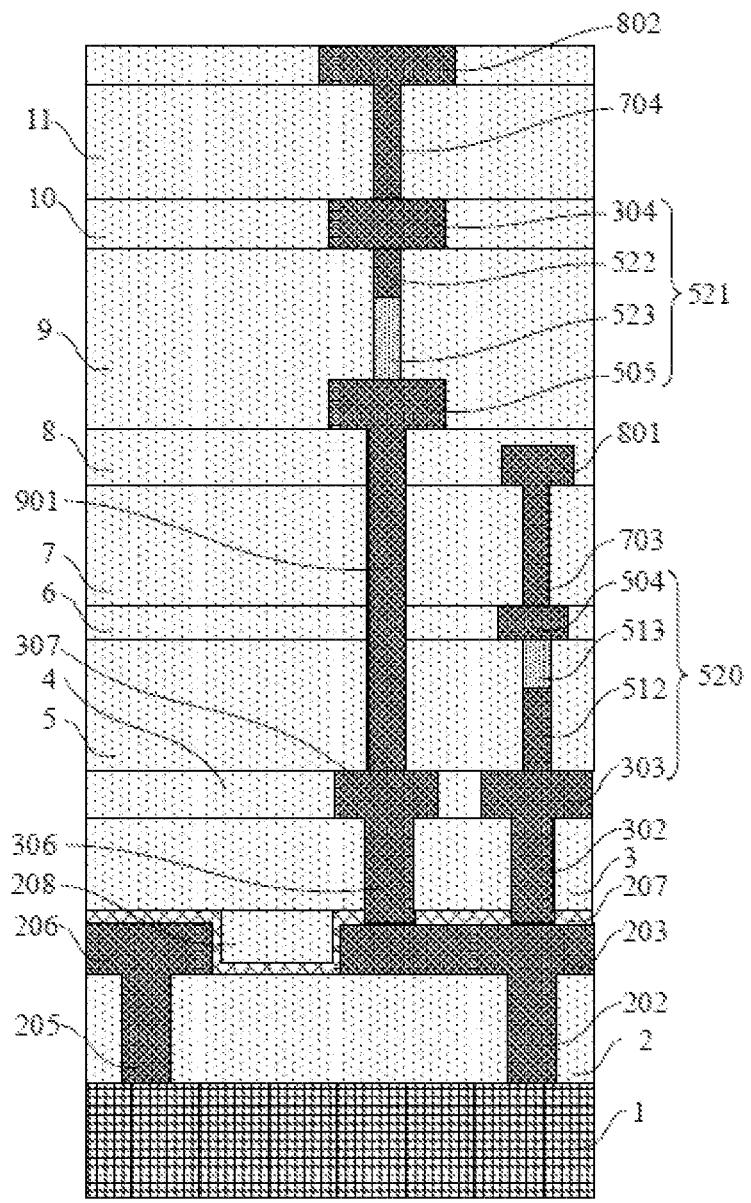
FIG. 33 is a schematic cross-sectional view of a structure obtained in step S513 in the manufacturing method of a semiconductor structure according to another embodiment of the present disclosure, that is, a schematic cross-sectional view of a semiconductor structure according to another embodiment of the present disclosure.

S513: As shown in FIG. 33, form a fourth plug 704 in the fourth interconnecting hole 702, and form a second bit line 802 on the tenth dielectric layer 11, where the second bit line 802 is electrically connected to the bottom electrode 304 of the second phase change memory structure 521 through the fourth plug 704.

In step S506, it may be understood that, for the process of forming the third dielectric layer 4, the fourth dielectric layer 5 and the fifth dielectric layer 6 that are sequentially stacked on the second dielectric layer 3 and forming the first phase change memory structure 520 in the third dielectric layer 4, the fourth dielectric layer 5, and the fifth dielectric layer 6, reference may be made to the detailed description of the process of forming the first phase change memory structure in step S206, and details are not described herein again.

Figure 24:
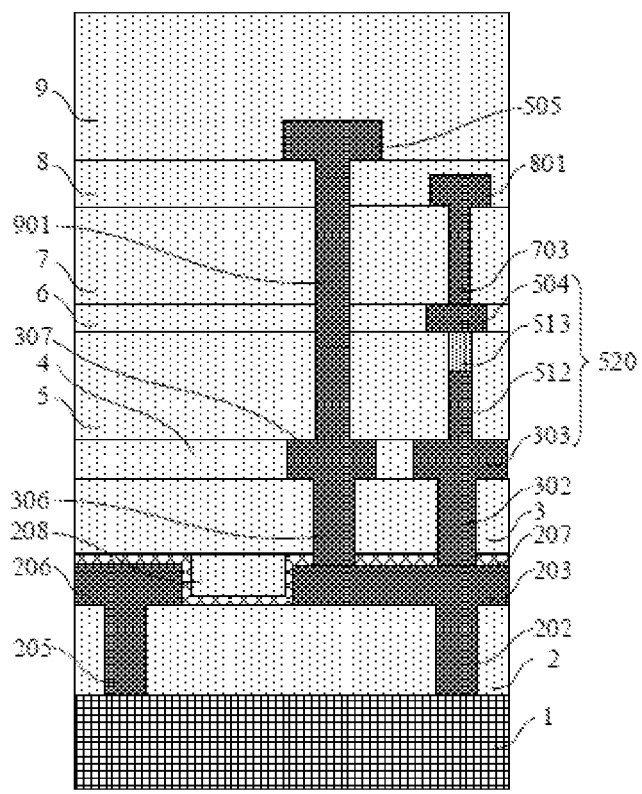
FIG. 24 is a schematic cross-sectional view of a structure obtained in step S602 in the manufacturing method of a semiconductor structure according to another embodiment of the present disclosure.
Figure 25:
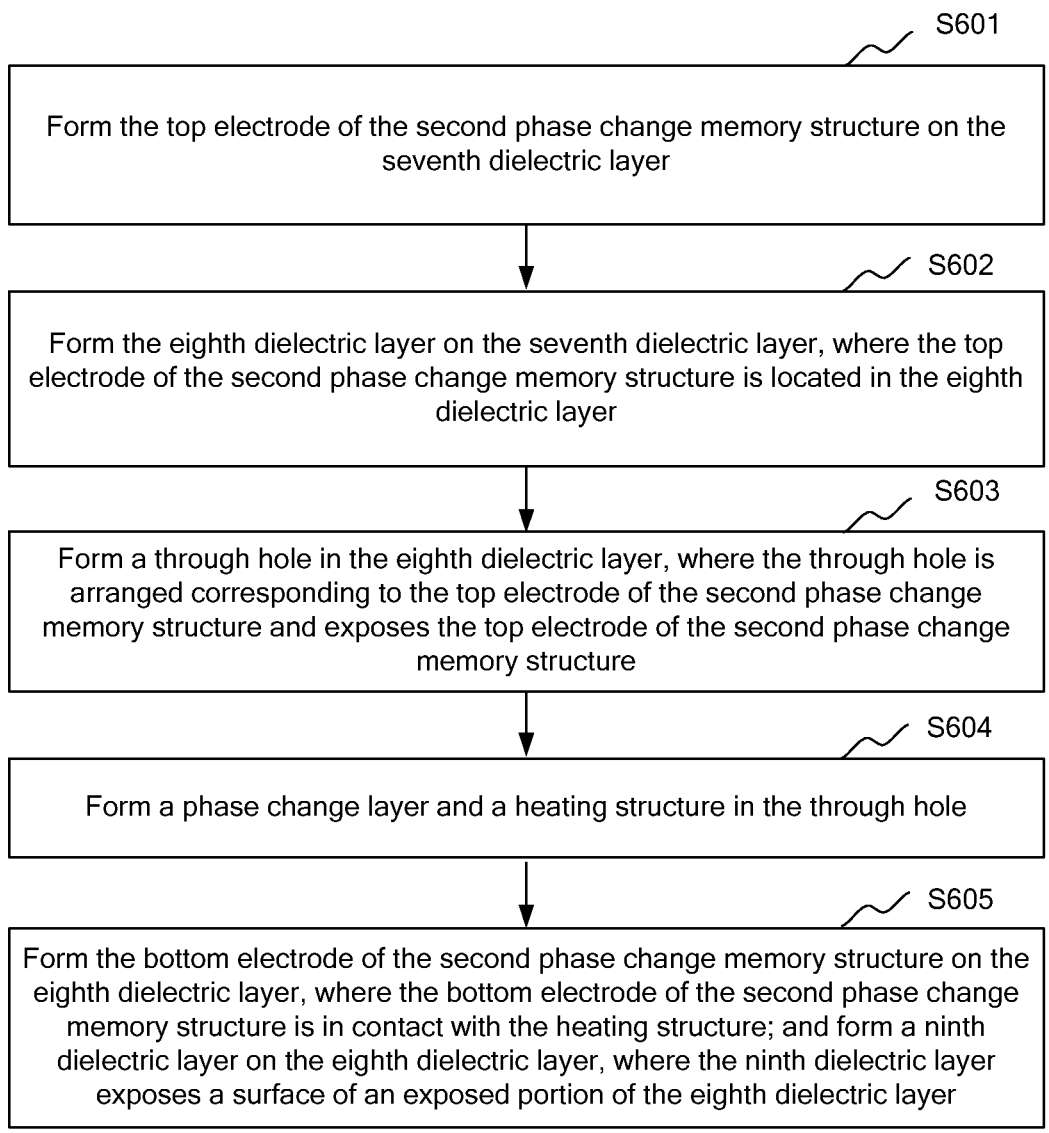
FIG. 25 is a flowchart of step S511 in the manufacturing method of a semiconductor structure according to an embodiment of the present disclosure.

For step S511, referring to FIG. 25 in conjunction with FIG. 24 to FIG. 32, in an embodiment, step S511 may specifically include the following steps:

S601: As shown in FIG. 24, form the top electrode 505 of the second phase change memory structure 521 on the seventh dielectric layer 8.

S602: As shown in FIG. 24, form the eighth dielectric layer 9 on the seventh dielectric layer 8, where the top electrode 505 of the second phase change memory structure 521 is located in the eighth dielectric layer 9.

Figure 26:
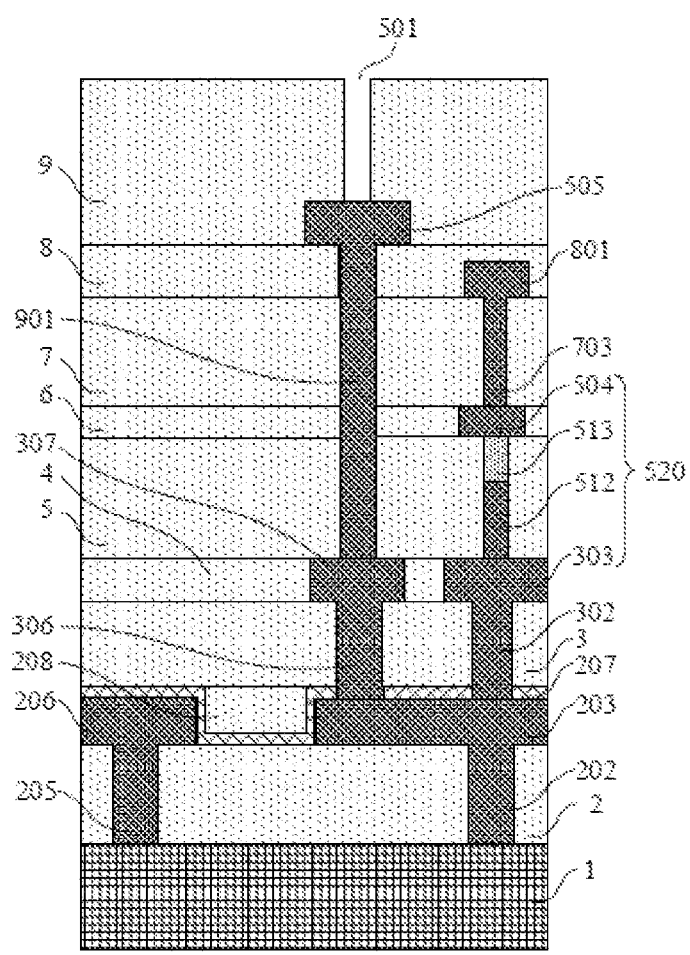
FIG. 26 is a schematic cross-sectional view of a structure obtained in step S603 in the manufacturing method of a semiconductor structure according to another embodiment of the present disclosure.

S603: As shown in FIG. 26, form a through hole 501 in the eighth dielectric layer 9, where the through hole 501 is arranged corresponding to the top electrode 505 of the second phase change memory structure 521 and exposes the top electrode 505 of the second phase change memory structure 521.

S604: As shown in FIG. 27 to FIG. 31, form a phase change layer 523 and a heating structure 522 in the through hole 501.

S605: As shown in FIG. 32, form the bottom electrode 304 of the second phase change memory structure 521 on the eighth dielectric layer 9, where the bottom electrode of the second phase change memory structure 521 is in contact with the heating structure 522; and form a ninth dielectric layer 10 on the eighth dielectric layer 9, where the ninth dielectric layer 10 covers a surface of an exposed portion of the eighth dielectric layer 9.

Figure 27:
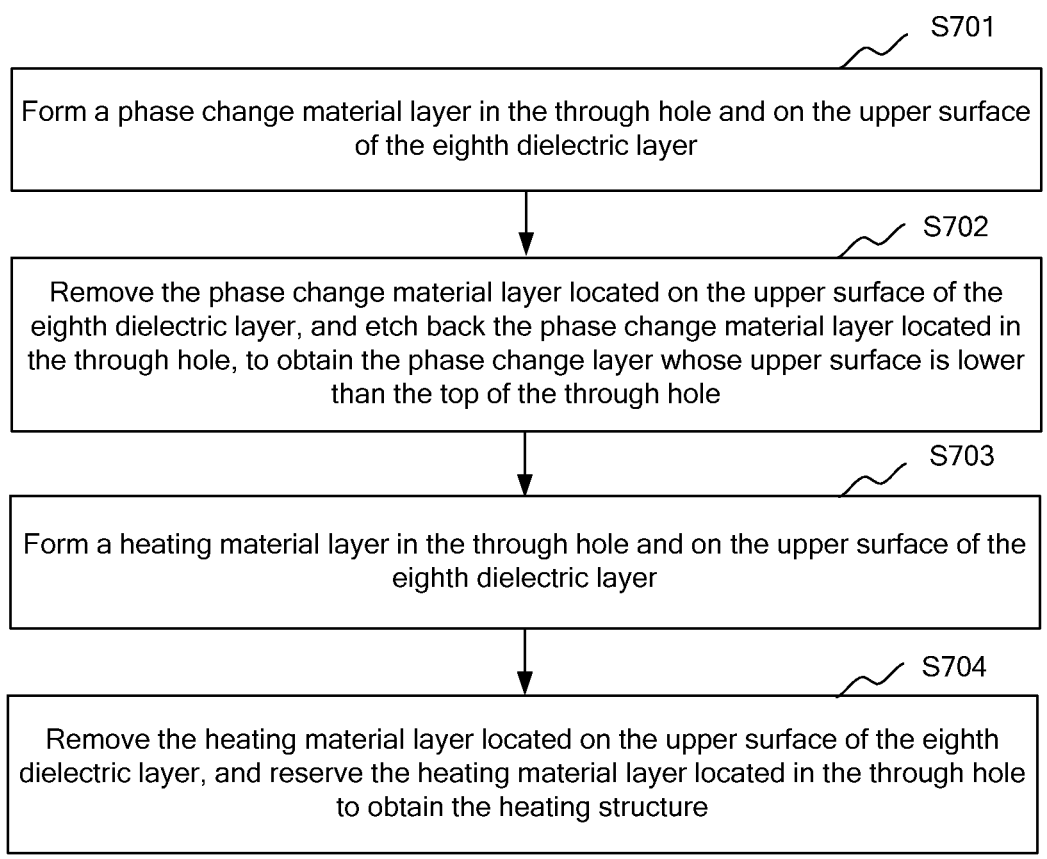
FIG. 27 is a flowchart of step S604 in the manufacturing method of a semiconductor structure according to an embodiment of the present disclosure.
Figure 28:
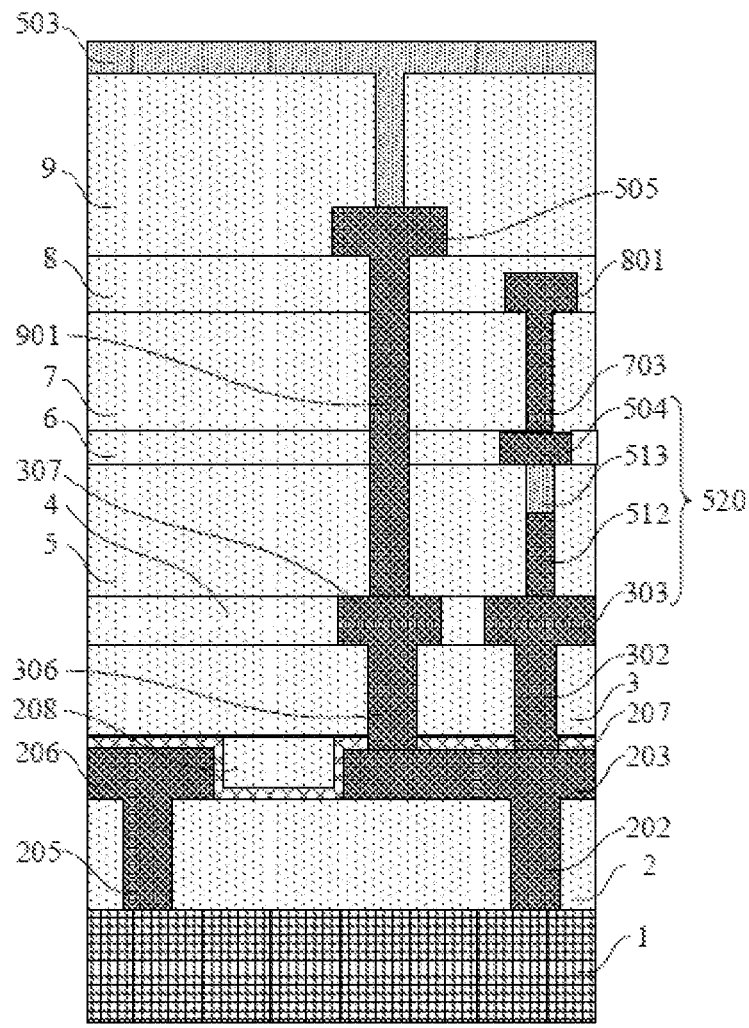
FIG. 28 is a schematic cross-sectional view of a structure obtained in step S701 in the manufacturing method of a semiconductor structure according to another embodiment of the present disclosure.

For step S604, referring to FIG. 27 in conjunction with FIG. 28 to FIG. 31, in an embodiment, step S604 may specifically include the following steps:

S701: As shown in FIG. 28, form a phase change material layer 503 in the through hole 501 and on the upper surface of the eighth dielectric layer 9.

Figure 29:
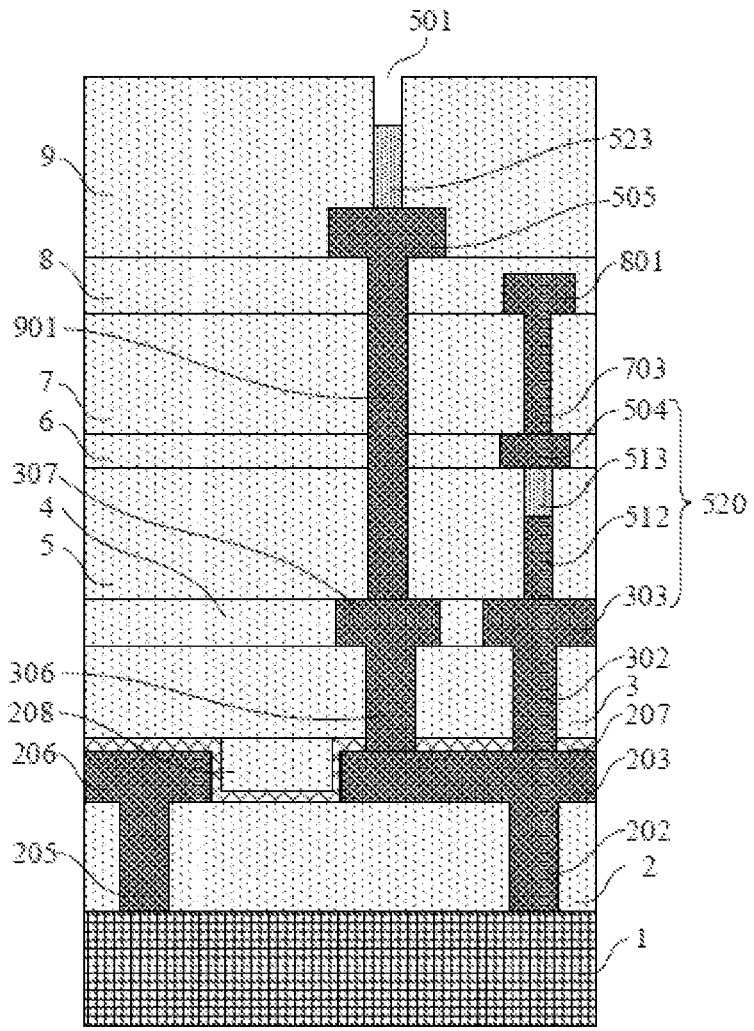
FIG. 29 is a schematic cross-sectional view of a structure obtained in step S702 in the manufacturing method of a semiconductor structure according to another embodiment of the present disclosure.

S702: As shown in FIG. 29, remove the phase change material layer 503 located on the upper surface of the eighth dielectric layer 9, and etch back the phase change material layer 503 located in the through hole 501, to obtain the phase change layer 523 whose upper surface is lower than the top of the through hole 501.

Figure 30:
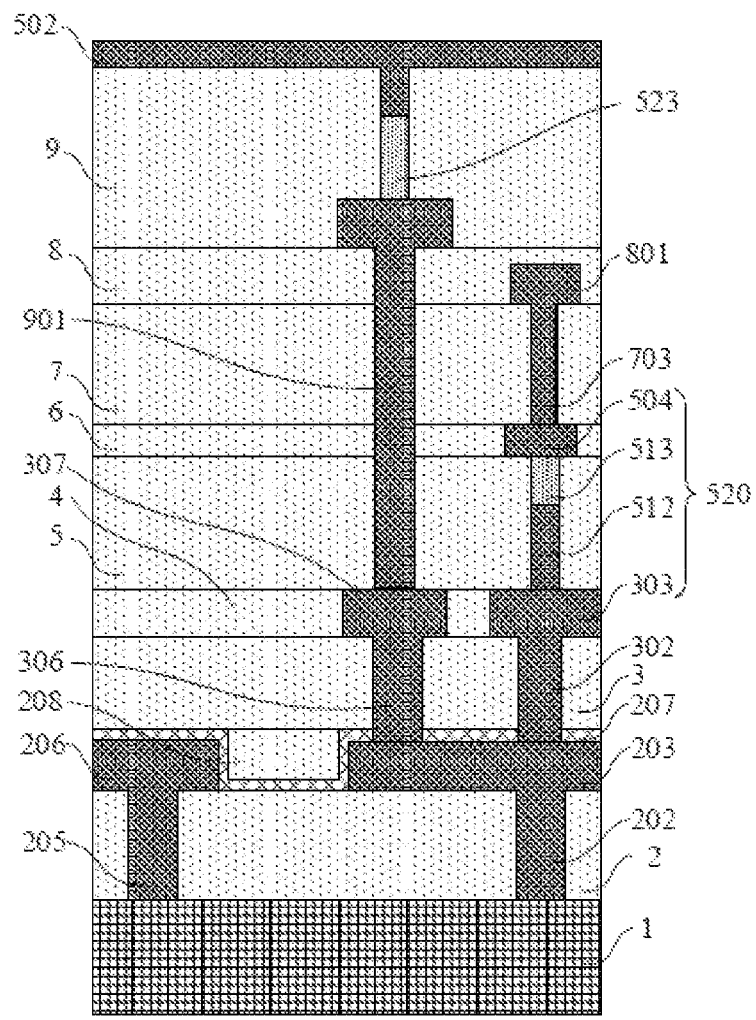
FIG. 30 is a schematic cross-sectional view of a structure obtained in step S703 in the manufacturing method of a semiconductor structure according to another embodiment of the present disclosure.

S703: As shown in FIG. 30, form a heating material layer 502 in the through hole 501 and on the upper surface of the eighth dielectric layer 9.

Figure 31:
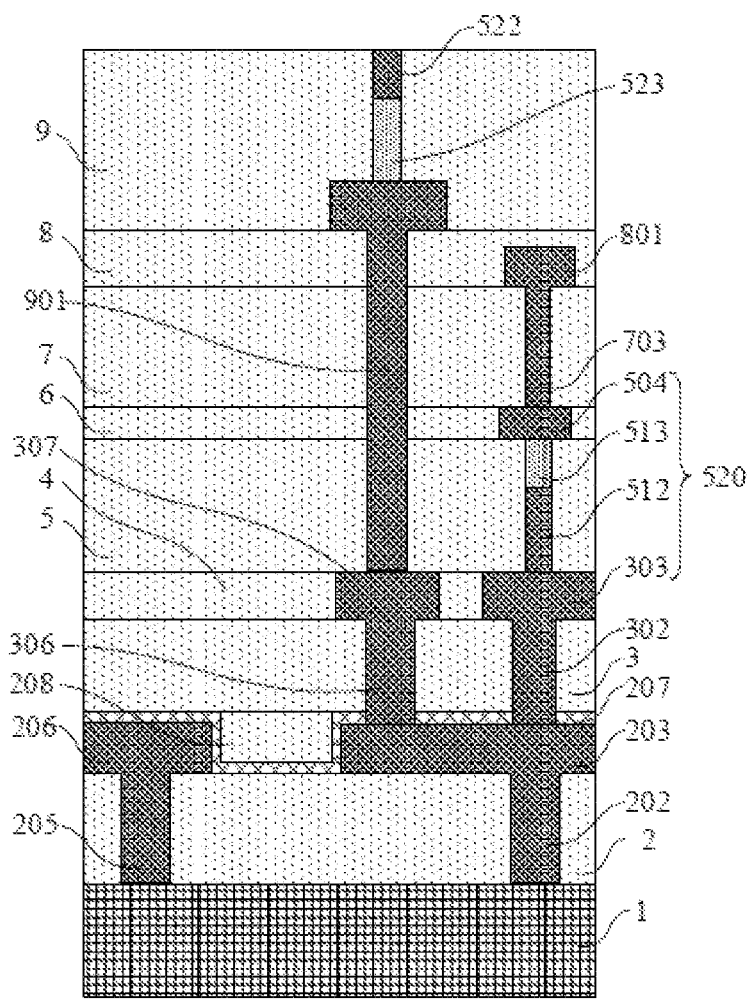
FIG. 31 is a schematic cross-sectional view of a structure obtained in step S704 in the manufacturing method of a semiconductor structure according to another embodiment of the present disclosure.

S704: As shown in FIG. 31, remove the heating material layer 502 located on the upper surface of the eighth dielectric layer 9, and reserve the heating material layer 502 located in the through hole 501 to obtain the heating structure 522.

It may be understood that, in other optional embodiments, the bottom electrode 304 of the second phase change memory structure 521 may also be flush with the top electrode 504 of the first phase change memory structure 520. With reference to FIG. 3 to FIG. 43, the following describes in detail an implementation in which the electrical connection between the top electrode 505 of the second phase change memory structure and the first interconnecting line 203 is implemented in another manner, and in the formed semiconductor structure, the bottom electrode 304 of the second phase change memory structure 521 may be flush with the top electrode 504 of the first phase change memory is structure 520.

Figure 34:
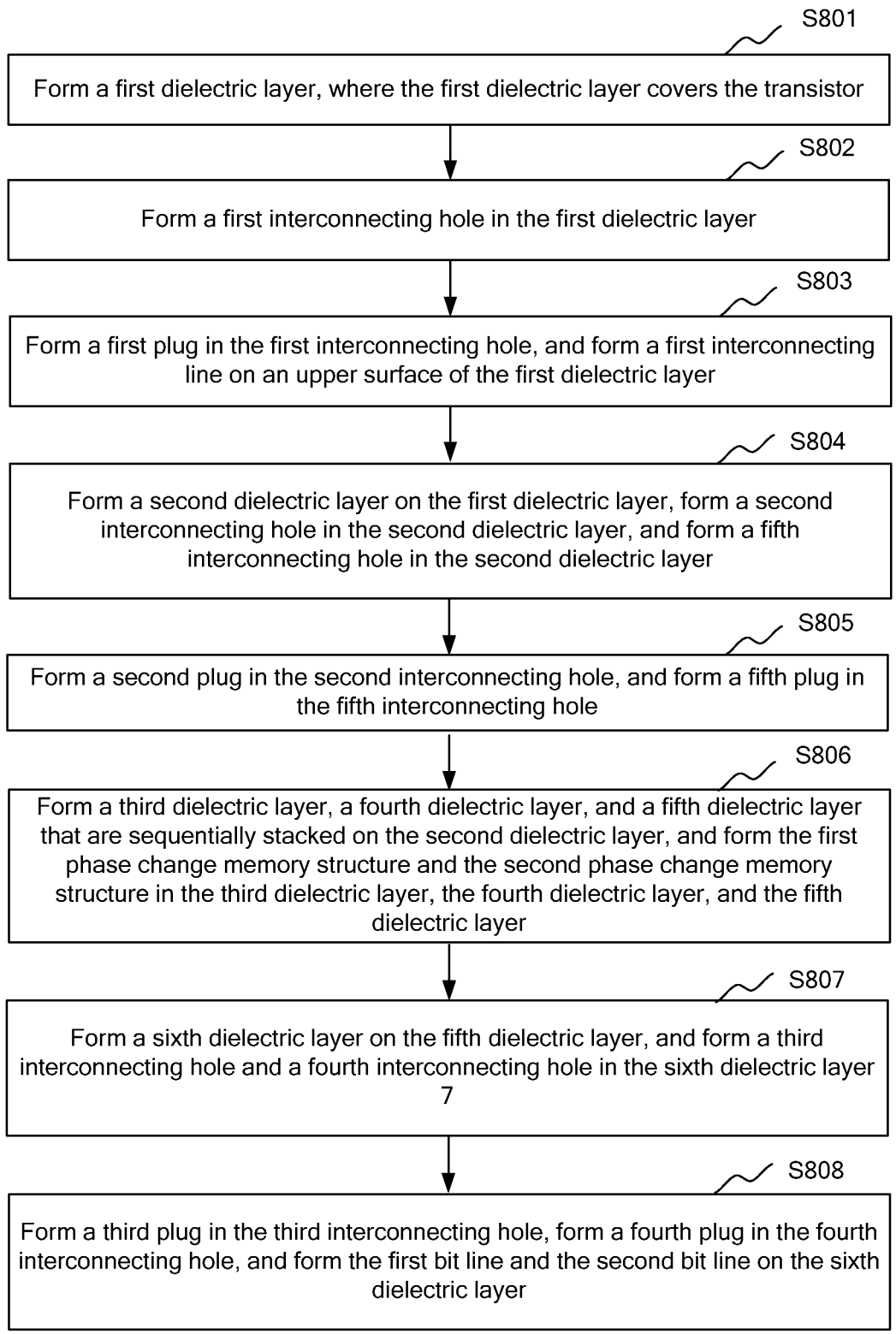
FIG. 34 is a flowchart of step S102 in the manufacturing method of a semiconductor structure according to still another embodiment of the present disclosure.

With reference to FIG. 34, in an embodiment, step S102 may further specifically include the following steps:

S801: As shown in FIG. 3, form a first dielectric layer 2, where the first dielectric layer covers the transistor 1.

S802: As shown in FIG. 3, form a first interconnecting hole 201 in the first dielectric layer 2, where the first interconnecting hole 201 exposes a first terminal of the transistor (the first terminal is not shown in FIG. 3).

S803: As shown in FIG. 4, form a first plug 202 in the first interconnecting hole 201, and form a first interconnecting line 203 on an upper surface of the first dielectric layer 2, where the first interconnecting line 203 is connected to the first terminal of the transistor through the first plug 202.

S804: As shown in FIG. 6, form a second dielectric layer 3 on the first dielectric layer 2, and form a second interconnecting hole 301 in the second dielectric layer 3, where the second interconnecting hole 301 exposes the first interconnecting line 203; meanwhile, form a fifth interconnecting hole 305 in the second dielectric layer 3.

S805: As shown in FIG. 19, form a second plug 302 in the second interconnecting hole 301; and form a fifth plug 306 in the fifth interconnecting hole 305.

S806: As shown in FIG. 19 and FIG. 36 to FIG. 41, form a third dielectric layer 4, a fourth dielectric layer 5, and a fifth dielectric layer 6 that are sequentially stacked on the second dielectric layer 3, and form the first phase change memory structure 520 and the second phase change memory structure 521 in the third dielectric layer 4, the fourth dielectric layer 5, and the fifth dielectric layer 6, where a bottom electrode 303 of the first phase change memory structure 520 is connected to the first interconnecting line 203 through the second plug 302, and a top electrode 505 of the second phase change memory structure 521 is connected to the first interconnecting line 203 through the fifth plug 306.

Figure 42:
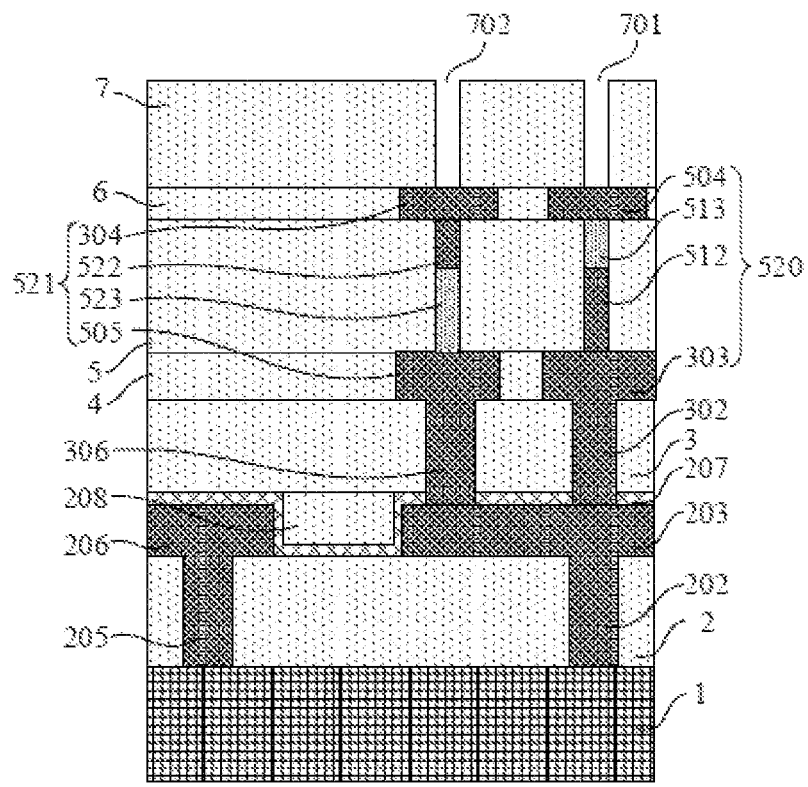
FIG. 42 is a schematic cross-sectional view of a structure obtained in step S807 in the manufacturing method of a semiconductor structure according to an embodiment of the present disclosure.

S807: As shown in FIG. 42, form a sixth dielectric layer 7 on the fifth dielectric layer 6, and form a third interconnecting hole 701 and a fourth interconnecting hole 702 in the sixth dielectric layer 7, where the third interconnecting hole 701 exposes a top electrode of the first phase change memory structure 520, and the fourth interconnecting hole exposes a bottom electrode 304 of the second phase change memory structure 521.

Figure 43:
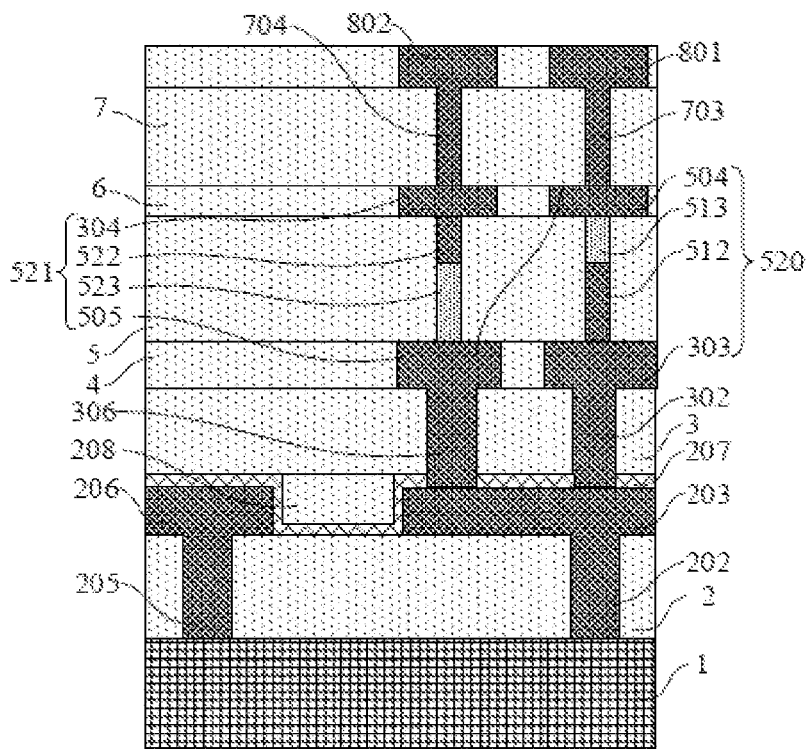
FIG. 43 is a schematic cross-sectional view of a structure obtained in step S808 in the manufacturing method of a semiconductor structure according to an embodiment of the present disclosure, that is, a schematic cross-sectional view of a semiconductor structure according to further another embodiment of the present disclosure.

S808: As shown in FIG. 43, form a third plug 703 in the third interconnecting hole 701, form a fourth plug 704 in the fourth interconnecting hole 702, and form the first bit line 801 and the second bit line 802 on the sixth dielectric layer 7, where the first bit line is electrically connected to the top electrode 504 of the first phase change memory structure 520 through the third plug 703, and the second bit line 802 is electrically connected to the bottom electrode 304 of the second phase change memory structure through the fourth plug 704.

Figure 35:
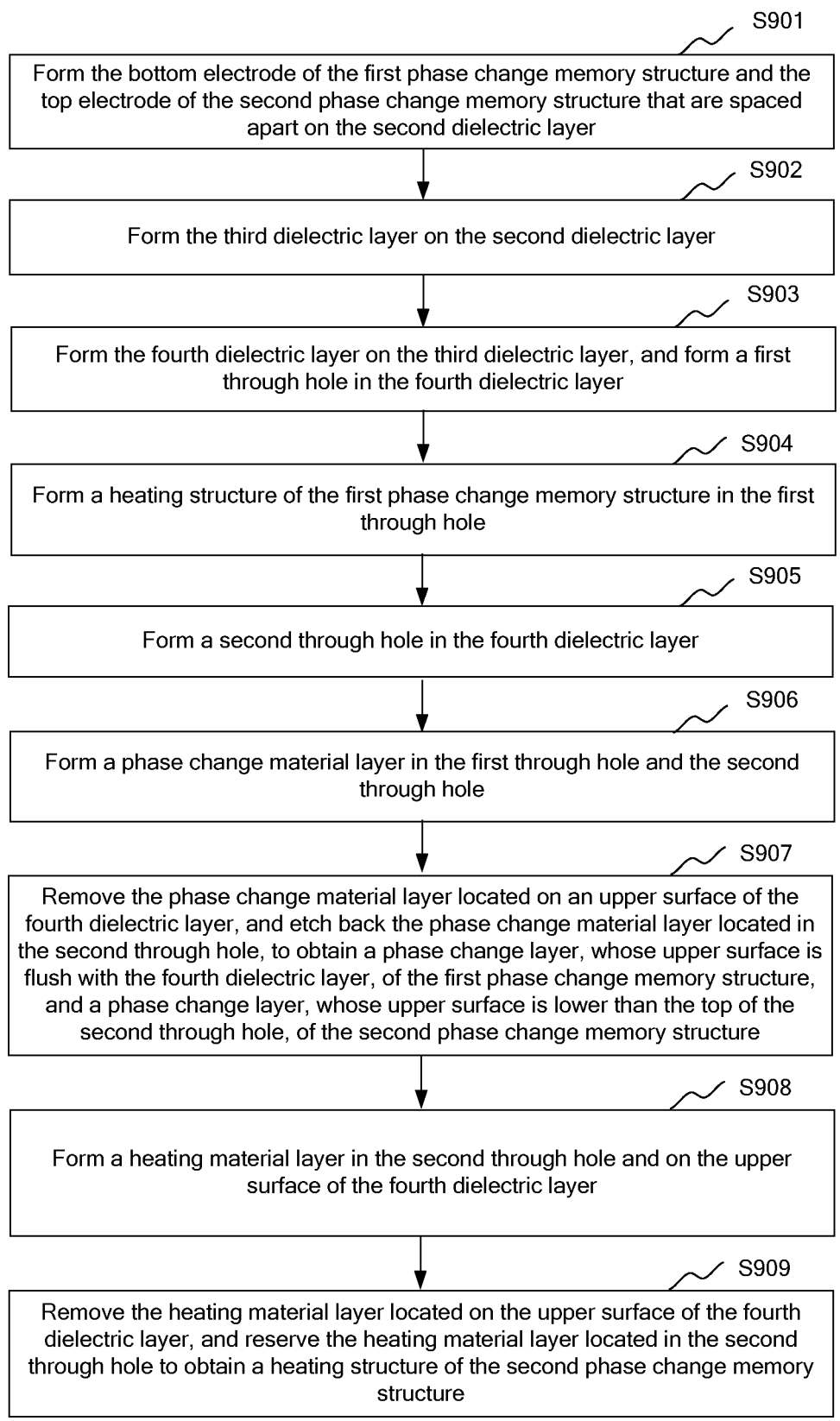
FIG. 35 is a flowchart of step S806 in the manufacturing method of a semiconductor structure according to an embodiment of the present disclosure.

For step S806, referring to FIG. 35 in conjunction with FIG. 19 and FIG. 36 to FIG. 41, in an embodiment, step S806 may specifically include the following steps:

S901: As shown in FIG. 19, form the bottom electrode 303 of the first phase change memory structure 520 and the top electrode 505 of the second phase change memory structure 521 that are spaced apart on the second dielectric layer 3.

S902: As shown in FIG. 19, form the third dielectric layer 4 on the second dielectric layer 3, where both the bottom electrode 303 of the first phase change memory structure and the top electrode 505 of the second phase change memory structure 521 are located in the third dielectric layer 4.

Figure 36:
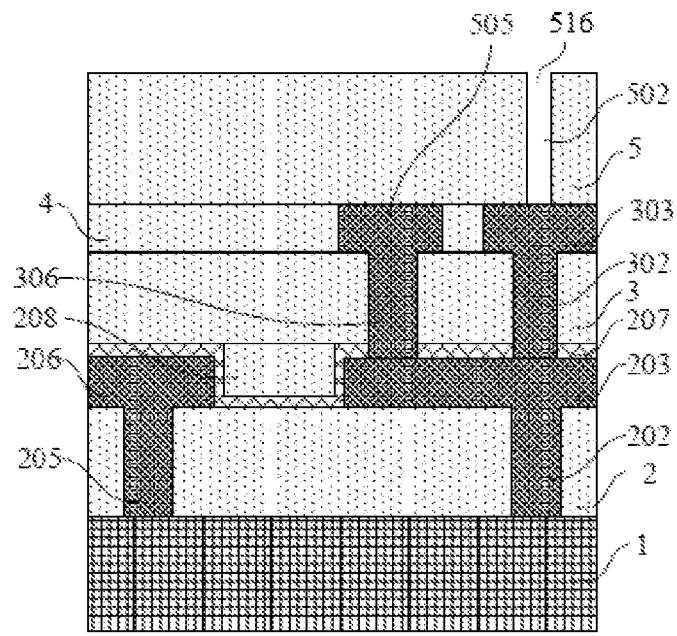
FIG. 36 is a schematic cross-sectional view of a structure obtained in step S903 in the manufacturing method of a semiconductor structure according to an embodiment of the present disclosure.

S903: As shown in FIG. 36, form the fourth dielectric layer 5 on the third dielectric layer 4, where the fourth dielectric layer 5 covers the bottom electrode 303 of the first phase change memory structure 520 and the top electrode 505 of the second phase change memory structure 521; form a first through hole 516 in the fourth dielectric layer 5, where the first through hole 516 is arranged corresponding to the bottom electrode 303 of the first phase change memory structure 520 and exposes the bottom electrode 303 of the first phase change memory structure 520.

Figure 37:
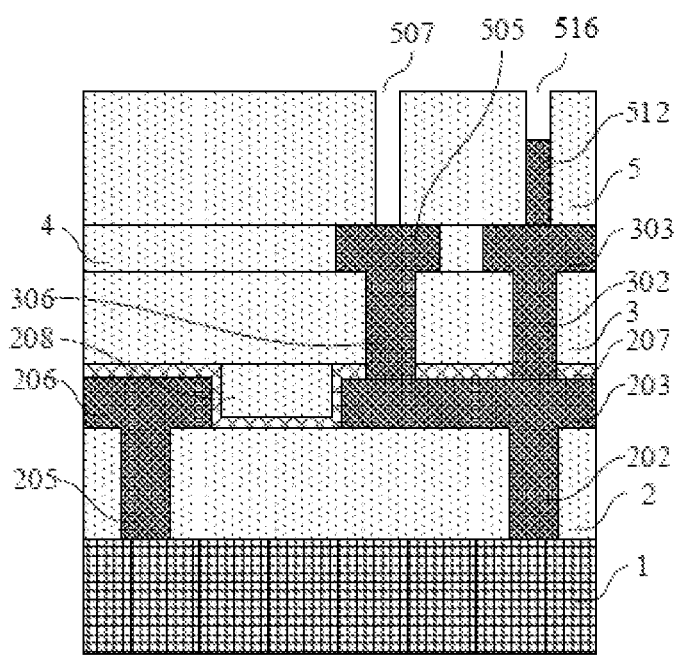
FIG. 37 is a schematic cross-sectional view of a structure obtained in step S905 in the manufacturing method of a semiconductor structure according to an embodiment of the present disclosure.

S904: As shown in FIG. 37, form a heating structure 512 of the first phase change memory structure 520 in the first through hole 516.

S905: As shown in FIG. 37, form a second through hole 507 in the fourth dielectric layer 5, where the second through hole 507 is arranged corresponding to the top electrode 505 of the second phase change memory structure 521 and exposes the top electrode 505 of the second phase change memory structure 521.

Figure 38:
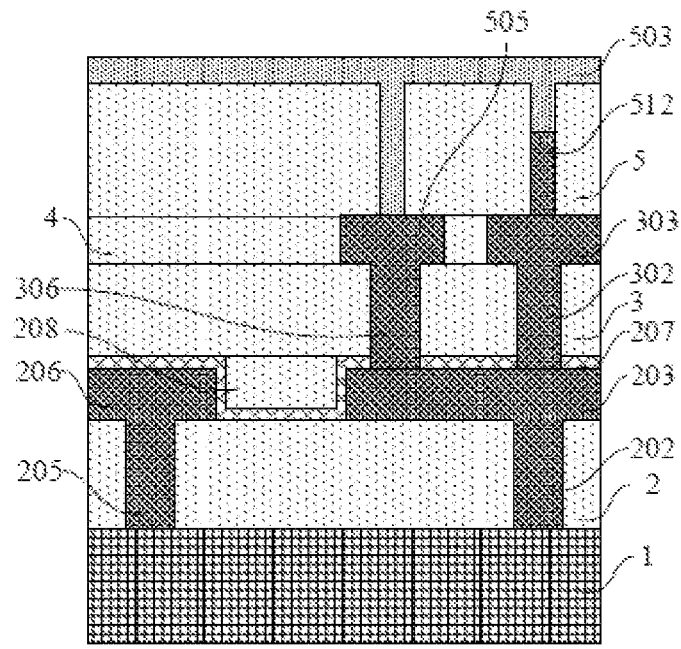
FIG. 38 is a schematic cross-sectional view of a structure obtained in step S906 in the manufacturing method of a semiconductor structure according to an embodiment of the present disclosure.

S906: As shown in FIG. 38, form a phase change material layer 503 in the first through hole 516 and the second through hole 507.

Figure 39:
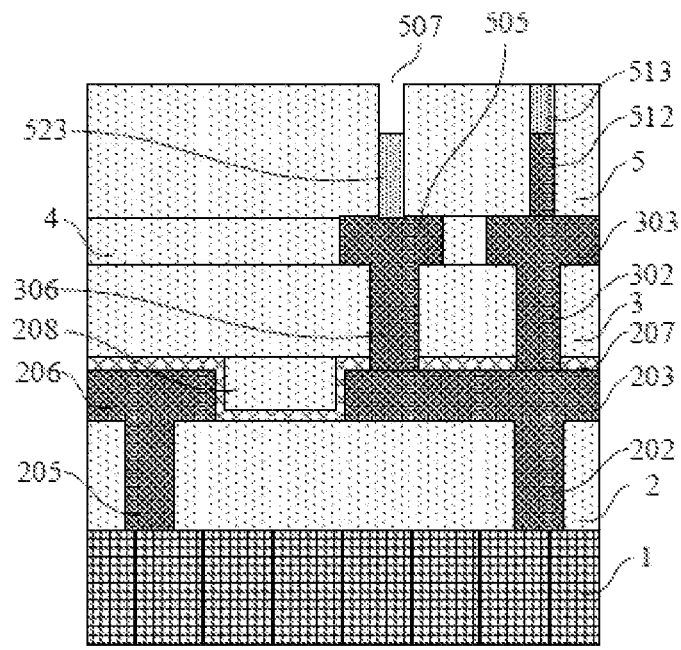
FIG. 39 is a schematic cross-sectional view of a structure obtained in step S907 in is the manufacturing method of a semiconductor structure according to an embodiment of the present disclosure.

S907: As shown in FIG. 39, remove the phase change material layer 503 located on an upper surface of the fourth dielectric layer 5, and etch back the phase change material layer 503 located in the second through hole 507, to obtain a phase change layer 513, whose upper surface is flush with the fourth dielectric layer 5, of the first phase change memory structure 520, and a phase change layer 523, whose upper surface is lower than the top of the second through hole 507, of the second phase change memory structure 521.

Figure 40:
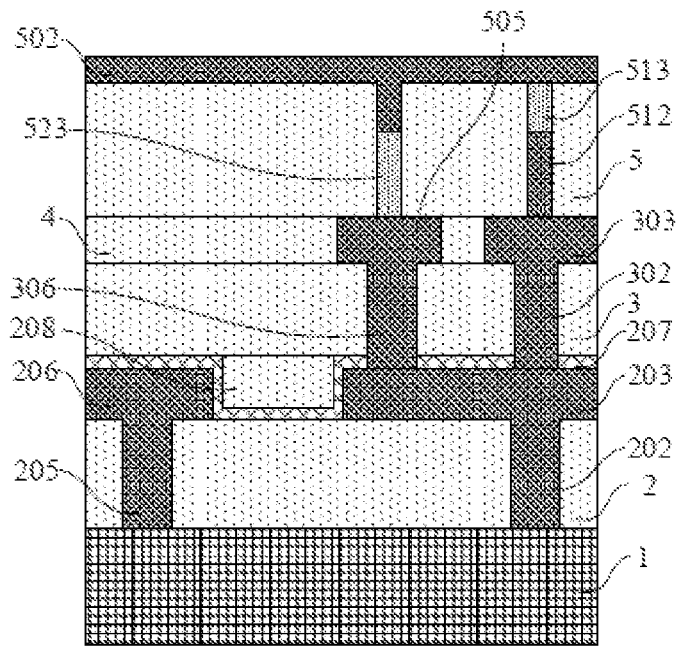
FIG. 40 is a schematic cross-sectional view of a structure obtained in step S908 in the manufacturing method of a semiconductor structure according to an embodiment of the present disclosure.

S908: As shown in FIG. 40, form a heating material layer 502 in the second through hole 507 and on the upper surface of the fourth dielectric layer 5.

Figure 41:
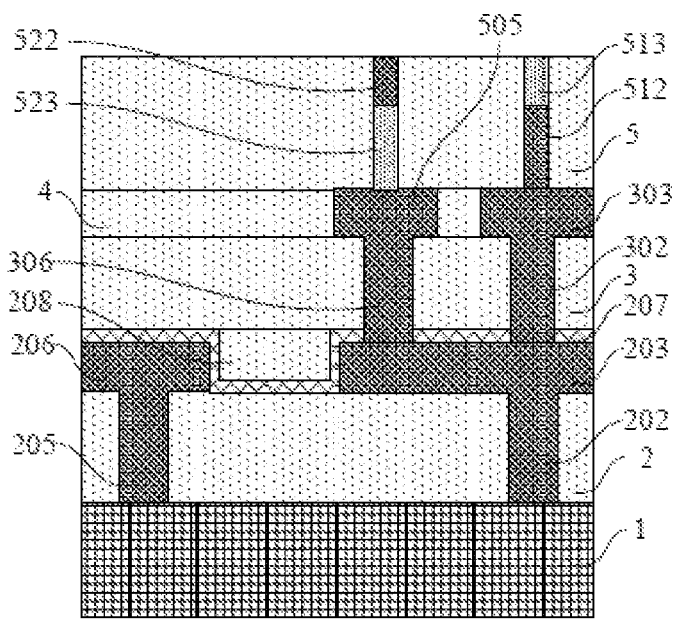
FIG. 41 is a schematic cross-sectional view of a structure obtained in step S909 in the manufacturing method of a semiconductor structure according to an embodiment of the present disclosure.

S909: As shown in FIG. 41, remove the heating material layer 502 located on the upper surface of the fourth dielectric layer 5, and reserve the heating material layer 502 located in the second through hole 507 to obtain a heating structure 522 of the second phase change memory structure 521.

For step S904, in an embodiment, step S904 may specifically include the following steps:

forming a heating material layer 502 in the first through hole 516 and on an upper surface of the fourth dielectric layer 5; and removing the heating material layer 502 located on the upper surface of the fourth dielectric layer 5, and etching back the heating material layer 502 located in the first through hole 516, to obtain the heating structure 512, whose upper surface is lower than the top of the first through hole 516, of the first phase change memory structure 520.

In another aspect, according to some embodiments, the present disclosure further provides a semiconductor structure. Further referring to FIG. 17, the semiconductor structure may include a transistor 1, a first phase change memory structure 520, a second phase change memory structure (not marked in FIG. 17), a first bit line 801, and a second bit line 802.

Specifically, a bottom electrode 303 of the first phase change memory structure is is electrically connected to a first terminal (not shown in FIG. 17) of the transistor 1; a top electrode 505 of the second phase change memory structure is electrically connected to the first terminal of the transistor 1; the first bit line 801 is electrically connected to a top electrode 504 of the first phase change memory structure; and the second bit line 802 is electrically connected to a bottom electrode 304 of the second phase change memory structure.

In the semiconductor structure provided by the present disclosure, two phase change memory structures form a complementary structure, where the first phase change memory structure and the second phase change memory structure may be constantly configured in complementary states (for example, the first phase change memory structure is in a crystalline phase while the second phase change memory structure is in an amorphous phase, and vice versa), so that no external reference signal is needed, thus achieving a high read speed, a large read margin, and high reliability.

Further referring to FIG. 17, in an embodiment, the first phase change memory structure 520 and the second phase change memory structure (not marked in FIG. 17) may each include a bottom electrode, a heating structure 512, a phase change layer 513, and a top electrode that are sequentially stacked from bottom to top.

Specifically, as shown in FIG. 17, the first phase change memory structure 520 may include the bottom electrode 303, the heating structure 512, the phase change layer 513, and the top electrode 504 of the first phase change memory structure that are sequentially stacked from bottom to top; the second phase change memory structure may include the bottom electrode 304, the heating structure 512, the phase change layer 513 and the top electrode 505 of the second phase change memory structure that are sequentially stacked from bottom to top.

In an embodiment, widths of the heating structure 512 and the phase change layer may be 10 nm to 20 nm, and specifically may be 10 nm, 12 nm, 15 nm, 18 nm or 20 nm. It should be noted that, the foregoing data is merely an example, and in an actual embodiment, the widths of the heating structure 512 and the phase change layer 513 are not limited to the foregoing data.

It should be further noted that, the present disclosure does not limit the relationship is between the height of the bottom electrode 304 of the second phase change memory structure and the height of the bottom electrode 303 of the first phase change memory structure. In an embodiment, further referring to FIG. 33, the bottom electrode 304 of the second phase change memory structure may be higher than the top electrode 504 of the first phase change memory structure. In another possible embodiment, further referring to FIG. 43, the bottom electrode 304 of the second phase change memory structure may alternatively be flush with the top electrode 504 of the first phase change memory structure.

Further referring to FIG. 17, in an embodiment, in the first phase change memory structure 520 and the second phase change memory structure, the bottom electrodes may be located in a same layer, the heating structures 512 may be located in a same layer, the phase change layers 513 may be located in a same layer, and the top electrodes may be located in a same layer.

Specifically, in other words, the bottom electrode 303 of the first phase change memory structure may be located in the same layer with the bottom electrode 304 of the second phase change memory structure; the heating structure 512 of the first phase change memory structure 520 may be located in the same layer with the heating structure of the second phase change memory structure; the phase change layer 513 of the first phase change memory structure 520 may be located in the same layer with the phase change layer 513 of the second phase change memory structure; the top electrode 504 of the first phase change memory structure may be located in the same layer with the top electrode 505 of the second phase change memory structure.

In the semiconductor structure provided by the present disclosure, in the first phase change memory structure 520 and the second phase change memory structure, the bottom electrodes are located in the same layer, the heating structures 512 are located in the same layer, the phase change layers 513 are located in the same layer, and the top electrodes are located in the same layer. In this way, during manufacturing of the semiconductor structure, the bottom electrode 303 of the first phase change memory structure and the bottom electrode 304 of the second phase change memory structure may be formed simultaneously in one process step; the heating structure 512 of the first is phase change memory structure 520 and the heating structure 512 of the second phase change memory structure may be formed simultaneously in one process step; the phase change layer 513 of the first phase change memory structure 520 and the phase change layer 513 of the second phase change memory structure may be formed simultaneously in one process step; the top electrode 504 of the first phase change memory structure and the top electrode 505 of the second phase change memory structure may be formed simultaneously in one process step, thereby further reducing the process steps and the cost.

In an embodiment, a width of the heating structure 512 is less than ⅕ of a width of the bottom electrode or the top electrode. It may be understood that, the present disclosure does not limit the ratio between the width of the heating structure 512 and the width of the bottom electrode or the top electrode. Optionally, the width of the heating structure 512 may be 1/10, ⅛ or ⅙ of the width of the bottom electrode or the top electrode.

Further referring to FIG. 17, in an embodiment, the semiconductor structure may further include an air gap 506; the present disclosure does not limit the specific position of the air gap 506. In an embodiment, the air gap 506 may be located between the heating structure 512 of the first phase change memory structure 520 and the heating structure of the second phase change memory structure, to reduce the parasitic capacitance between the heating structure 512 of the first phase change memory structure 520 and the heating structure 512 of the second phase change memory structure. The present disclosure does not limit a height of the top of the air gap. In another possible embodiment, the top of the air gap 506 may be higher than a lower surface of the top electrode 504 of the first phase change memory structure and a lower surface of the top electrode 505 of the second phase change memory structure.

Further referring to FIG. 17, in an embodiment, the first bit line 801 may be located in a same layer with the second bit line 802.

In the semiconductor structure provided by the foregoing embodiment, the first bit line is located in the same layer with the second bit line, so that during manufacturing of the semiconductor structure, the first bit line and the second bit line can be formed simultaneously in one process step, thereby further reducing the process steps and the cost.

Further referring to FIG. 17, in an embodiment, both the top electrode 505 of the second phase change memory structure and the bottom electrode 303 of the first phase change memory structure may be electrically connected to the first terminal of the transistor 1 through a first interconnecting line 203.

Further referring to FIG. 17, in an embodiment, the first interconnecting line 203 may be connected to the first terminal of the transistor 1 through a first plug 202; the bottom electrode 303 of the first phase change memory structure may be connected to the first interconnecting line 203 through a second plug 302; the top electrode 504 of the first phase change memory structure is connected to the first bit line 801 through a third plug 703. In this case, the bottom electrode 304 of the second phase change memory structure is connected to the second bit line 802 through a fourth plug 704, and the top electrode of the second phase change memory structure is electrically connected to the first interconnecting line 203.

Further referring to FIG. 17, in an embodiment, the semiconductor structure may further include a second interconnecting line 307; the second interconnecting line 307 is located on the first interconnecting line 203, is connected to the first interconnecting line through a fifth plug 306, and is electrically connected to the top electrode 505 of the second phase change memory structure.

Further referring to FIG. 17, in an embodiment, the semiconductor structure may further include a third interconnecting line 803; the third interconnecting line 803 is located on the second interconnecting line 307, is connected to the second interconnecting line through a sixth plug 707, and is connected to the top electrode 505 of the second phase change memory structure through a seventh plug 708.

It should be noted that, as shown in FIG. 17, in an embodiment, the semiconductor structure may further include a first dielectric layer 2, a second dielectric layer 3, a third dielectric layer 4, a fourth dielectric layer 5, a fifth dielectric layer 6, and a sixth dielectric layer 7 that are sequentially stacked from bottom to top. With reference to FIG. 17, the first dielectric layer 2, the second dielectric layer 3, the third dielectric layer 4, the fourth is dielectric layer 5, the fifth dielectric layer 6, and the sixth dielectric layer 7 are described in further detail below.

The first dielectric layer 2 covers the transistor 1, the first plug 202 is located in the first dielectric layer 2, and the first interconnecting line 203 is located on the first dielectric layer 2. The second dielectric layer 3 is located on the first dielectric layer 2, and the second plug 302 is located in the second dielectric layer 3. The first phase change memory structure 520 and the second phase change memory structure 521 are located in the third dielectric layer 4, the fourth dielectric layer 5, and the fifth dielectric layer 6 that are sequentially stacked from bottom to top. The sixth dielectric layer 7 is located on the fifth dielectric layer 6, the third plug 703 is located in the sixth dielectric layer 7, and the fourth plug 704 is located in the sixth dielectric layer 7, the fifth dielectric layer 6, and the fourth dielectric layer 5.

Specifically, both the bottom electrode 303 of the first phase change memory structure and the bottom electrode 304 of the second phase change memory structure may be located in the third dielectric layer 4; the heating structure 512 and the phase change layer 513 may be both located in the fourth dielectric layer 5, and the air gap 506 may also be located in the fourth dielectric layer 5; both the top electrode 504 of the first phase change memory structure and the top electrode 505 of the second phase change memory structure may be located in the fifth dielectric layer 6.

Specifically, the fifth plug 306 may also be located in the second dielectric layer 3. In this case, the second interconnecting line 307 may be located in the third dielectric layer 4; the sixth plug 707 may be located in the sixth dielectric layer 7, the fifth dielectric layer 6, and the fourth dielectric layer 5, and the seventh plug 708 may be located in the sixth dielectric layer 7; the third interconnecting line 803 may be located on the sixth dielectric layer 7.

Specifically, the eighth plug 205 may also be located in the first dielectric layer 2. In this case, the control line 206 may be located on the first dielectric layer 2.

It should be noted that, the present disclosure does not limit the specific form of the electrical connection between the top electrode 505 of the second phase change memory structure and the first interconnecting line 203. FIG. 17 shows some optional embodiments in which the top electrode 505 of the second phase change memory structure is connected to the first interconnecting line 203 through the seventh plug 708, the third interconnecting line 803, the sixth plug 707, the second interconnecting line 307, and the fifth plug 306 in sequence. In other optional embodiments, the top electrode 505 of the second phase change memory structure may be electrically connected to the first interconnecting line 203 in other manners.

Other forms of the electrical connection between the top electrode 505 of the second phase change memory structure and the first interconnecting line 203 are described in further detail below.

Referring to FIG. 18, in an embodiment, the top electrode 505 of the second phase change memory structure may alternatively be directly connected to the second interconnecting line 307 through a ninth plug 901. In other words, in this case, the top electrode 505 of the second phase change memory structure may be connected to the first interconnecting line 203 through the ninth plug 901, the second interconnecting line 307, and the fifth plug 306 in sequence.

In the semiconductor structure provided by the foregoing embodiment, the top electrode of the second phase change memory structure is directly connected to the second interconnecting line through the ninth plug, which reduces the lateral dimension of the semiconductor structure, thereby enhancing dissipation and increasing the density.

It should be understood that although the steps in the flowcharts of FIG. 1, FIG. 2, FIG. 7, FIG. 10, FIG. 18, FIG. 25, FIG. 27, FIG. 34 and FIG. 35 are shown in sequence according to the arrows, these steps are not necessarily executed in the sequence indicated by the arrows. The execution order of these steps is not strictly limited, and these steps may be executed in other orders, unless clearly described otherwise. Moreover, at least some of the steps in FIG. 1, FIG. 2, FIG. 7, FIG. 10, FIG. 18, FIG. 25, FIG. 27, FIG. 34 and FIG. 35 may include a plurality of sub-steps or stages. The sub-steps or stages are not necessarily executed at the same time, but may be executed at different times. The sub-steps or stages are not necessarily carried out sequentially, but may be executed alternately with other steps or at least some of sub-steps or stages of other steps.

The technical characteristics of the foregoing examples can be employed in arbitrary combinations. To provide a concise description of these examples, all possible combinations of all technical characteristics of the embodiment may not be described; however, these combinations of technical characteristics should be construed as disclosed in the description as long as no contradiction occurs.

Only several embodiments of the present application are described in detail above, but they should not therefore be construed as limiting the scope of the present application. It should be noted that those of ordinary skill in the art can further make variations and improvements without departing from the conception of the present application. These variations and improvements all fall within the protection scope of the present application. Therefore, the protection scope of the present disclosure should be subject to the protection scope defined by the claims.

The invention claimed is:

1. A semiconductor structure, comprising:
a transistor;
a first phase change memory structure, a bottom electrode of the first phase change memory structure being electrically connected to a first terminal of the transistor;
a second phase change memory structure, a top electrode of the second phase change memory structure being electrically connected to the first terminal of the transistor;
a first bit line, electrically connected to a top electrode of the first phase change memory structure; and
a second bit line, electrically connected to a bottom electrode of the second phase change memory structure;
wherein the top electrode of the second phase change memory structure and the bottom electrode of the first phase change memory structure are both electrically connected to the first terminal of the transistor through a first interconnecting line.

2. The semiconductor structure according to claim 1, wherein each of the first phase change memory structure and the second phase change memory structure comprises: the bottom electrode, a heating structure, a phase change layer, and the top electrode that are sequentially stacked from bottom to top.

3. The semiconductor structure according to claim 2, wherein the bottom electrode of the first phase change memory structure is located in a same layer with the bottom electrode of the second phase change memory structure, the heating structure of the first phase change memory structure is located in a same layer with the heating structure of the second phase change memory structure, the phase change layer of the first phase change memory structure is located in a same layer with the phase change layer of the second phase change memory structure, and the top electrode of the first phase change memory structure is located in a same layer with the top electrode of the second phase change memory structure.

4. The semiconductor structure according to claim 3, wherein a width of the heating structure is less than ⅕ of a width of the bottom electrode or the top electrode; and
the semiconductor structure further comprises:
an air gap, located between the heating structure of the first phase change memory structure and the heating structure of the second phase change memory structure;
wherein a top of the air gap is higher than a lower surface of the top electrode of the first phase change memory structure and a lower surface of the top electrode of the second phase change memory structure.

5. The semiconductor structure according to claim 1, wherein the first phase change memory structure comprises the bottom electrode, a heating structure, a phase change layer, and the top electrode that are sequentially stacked from bottom to top; the second phase change memory structure comprises the top electrode, a phase change layer, a heating structure, and the bottom electrode that are sequentially stacked from bottom to top;
wherein one of:
the bottom electrode of the second phase change memory structure is higher than the top electrode of the first phase change memory structure, or the bottom electrode of the second phase change memory structure is flush with the top electrode of the first phase change memory structure;
wherein the first bit line is located in a same layer with the second bit line.

6. The semiconductor structure according to claim 1, wherein the first interconnecting line is connected to the first terminal of the transistor through a first plug;
the bottom electrode of the first phase change memory structure is connected to the first interconnecting line through a second plug, and the top electrode of the first phase change memory structure is connected to the first bit line through a third plug; and
the bottom electrode of the second phase change memory structure is connected to the second bit line through a fourth plug, and the top electrode of the second phase change memory structure is electrically connected to the first interconnecting line.

7. The semiconductor structure according to claim 6, the semiconductor structure further comprises:
a second interconnecting line, located on the first interconnecting line, connected to the first interconnecting line through a fifth plug, and electrically connected to the top electrode of the second phase change memory structure; and
a third interconnecting line, located on the second interconnecting line, connected to the second interconnecting line through a sixth plug, and connected to the top electrode of the second phase change memory structure through a seventh plug.

8. A manufacturing method of a semiconductor structure, comprising:
forming a transistor;
forming a first phase change memory structure, a second phase change memory structure, a first bit line, and a second bit line, wherein
a bottom electrode of the first phase change memory structure and a top electrode of the second phase change memory structure are both electrically connected to a first terminal of the transistor through a first interconnecting line;
the first bit line is electrically connected to a top electrode of the first phase change memory structure; and
the second bit line is electrically connected to a bottom electrode of the second phase change memory structure.

9. The manufacturing method of a semiconductor structure according to claim 8, wherein the forming a first phase change memory structure, a second phase change memory structure, a first bit line, and a second bit line comprises:
forming a first dielectric layer, wherein the first dielectric layer covers the transistor;
forming a first interconnecting hole in the first dielectric layer, wherein the first interconnecting hole exposes the first terminal of the transistor;
forming a first plug in the first interconnecting hole, and forming the first interconnecting line on an upper surface of the first dielectric layer, wherein the first interconnecting line is connected to the first terminal of the transistor through the first plug;
forming a second dielectric layer on the first dielectric layer, and forming a second interconnecting hole in the second dielectric layer, wherein the second interconnecting hole exposes the first interconnecting line;
forming a second plug in the second interconnecting hole;
forming a third dielectric layer, a fourth dielectric layer, and a fifth dielectric layer that are sequentially stacked on the second dielectric layer, and forming the first phase change memory structure and the second phase change memory structure in the third dielectric layer, the fourth dielectric layer, and the fifth dielectric layer, wherein the bottom electrode of the first phase change memory structure is connected to the first interconnecting line through the second plug, and the top electrode of the second phase change memory structure is electrically connected to the first interconnecting line;
forming a sixth dielectric layer on the fifth dielectric layer, forming a third interconnecting hole in the sixth dielectric layer, and forming a fourth interconnecting hole in the sixth dielectric layer, the fifth dielectric layer, and the fourth dielectric layer, wherein the third interconnecting hole exposes the top electrode of the first phase change memory structure, and the fourth interconnecting hole exposes the bottom electrode of the second phase change memory structure; and
forming a third plug in the third interconnecting hole, forming a fourth plug in the fourth interconnecting hole, and forming the first bit line and the second bit line on the sixth dielectric layer, wherein the first bit line is electrically connected to the top electrode of the first phase change memory structure through the third plug, and the second bit line is electrically connected to the bottom electrode of the second phase change memory structure through the fourth plug.

10. The manufacturing method of a semiconductor structure according to claim 9, wherein the forming a third dielectric layer, a fourth dielectric layer, and a fifth dielectric layer that are sequentially stacked on the second dielectric layer, and forming the first phase change memory structure and the second phase change memory structure in the third dielectric layer, the fourth dielectric layer, and the fifth dielectric layer comprises:
forming a pair of bottom electrodes spaced apart on the second dielectric layer, the pair of bottom electrodes are used as the bottom electrode of the first phase change memory structure and the bottom electrode of the second phase change memory structure respectively;
forming the third dielectric layer on the second dielectric layer, wherein both the bottom electrode of the first phase change memory structure and the bottom electrode of the second phase change memory structure are located in the third dielectric layer;
forming the fourth dielectric layer on the third dielectric layer, wherein the fourth dielectric layer covers the pair of bottom electrodes; forming through holes in the fourth dielectric layer, wherein the through holes correspond to the pair of bottom electrodes in a one-to-one manner, and expose the pair of bottom electrodes; and forming an air gap in the fourth dielectric layer, wherein the air gap is located between the through holes;
forming a heating structure and a phase change layer in each of the through holes; and
forming a pair of top electrodes spaced apart on the fourth dielectric layer, wherein the pair of top electrodes are in contact with the phase change layers; and forming the fifth dielectric layer on the fourth dielectric layer, wherein the fifth dielectric layer covers a surface of an exposed portion of the fourth dielectric layer.

11. The manufacturing method of a semiconductor structure according to claim 10, wherein the forming a heating structure and a phase change layer in each of the through holes comprises:
- forming a heating material layer in each of the through holes and on an upper surface of the fourth dielectric layer;
- removing the heating material layer located on the upper surface of the fourth dielectric layer, and etching back the heating material layer located in the through holes, to obtain the heating structures whose upper surface is lower than a top of the through holes;
- forming a phase change material layer in each of the through holes and on the upper surface of the fourth dielectric layer;
- removing the phase change material layer located on the upper surface of the fourth dielectric layer, and reserving the phase change material layer located in the through holes to obtain the phase change layers;
- wherein while the second interconnecting hole is formed in the second dielectric layer, a fifth interconnecting hole is further formed in the second dielectric layer;
- while the second plug is formed in the second interconnecting hole, a fifth plug is further formed in the fifth interconnecting hole;
- while the pair of bottom electrodes spaced apart are formed on the second dielectric layer, a second interconnecting line is further formed between the pair of bottom electrodes, wherein a gap exists between the second interconnecting line and the pair of bottom electrodes, and the gap between the second interconnecting line and the pair of bottom electrodes is filled with the third dielectric layer; and
- while the fourth interconnecting hole is formed in the sixth dielectric layer, the fifth dielectric layer, and the fourth dielectric layer, a sixth interconnecting hole is further formed in the sixth dielectric layer, the fifth dielectric layer, and the fourth dielectric layer, and a seventh interconnecting hole is formed in the sixth dielectric layer, wherein the sixth interconnecting hole exposes the second interconnecting line, and the seventh interconnecting hole exposes the top electrode of the second phase change memory structure;
- while the third plug is formed in the third interconnecting hole and the fourth plug is formed in the fourth interconnecting hole, a sixth plug is further formed in the sixth interconnecting hole, and a seventh plug is formed in the seventh interconnecting hole; and
- while the first bit line and the second bit line are formed on the sixth dielectric layer, a third interconnecting line is further formed on the sixth dielectric layer.

12. The manufacturing method of a semiconductor structure according to claim 9, wherein while the first interconnecting hole is formed in the first dielectric layer, an eighth interconnecting hole is further formed in the first dielectric layer, and the eighth interconnecting hole exposes a second terminal of the transistor;
- while the first plug is formed in the first interconnecting hole, an eighth plug is formed in the eighth interconnecting hole; and
- while the first interconnecting line is formed on the upper surface of the first dielectric layer, a control line is further formed on the upper surface of the first dielectric layer, and a gap exists between the control line and the first interconnecting line.

13. The manufacturing method of a semiconductor structure according to claim 12, after forming the first interconnecting line and the control line and before forming the second dielectric layer, the manufacturing method further comprises:
- forming an etching stop layer on the first interconnecting line, the control line, and an exposed portion of the first dielectric layer;
- after forming the etching stop layer and before forming the second dielectric layer, the manufacturing method further comprises:
  - forming a dielectric filler layer on an upper surface of the etching stop layer between the first interconnecting line and the control line, wherein the gap between the first interconnecting line and the control line is filled with the dielectric filler layer;
- wherein while the first interconnecting hole and the eighth interconnecting hole are formed in the first dielectric layer, a ninth interconnecting hole is further formed in the first dielectric layer, and the ninth interconnecting hole exposes a control terminal of the transistor; and
- while the first plug is formed in the first interconnecting hole and the eighth plug is formed in the eighth interconnecting hole, a ninth lead-out structure is further formed in the ninth interconnecting hole.

14. The manufacturing method of a semiconductor structure according to claim 8, wherein the forming a first phase change memory structure, a second phase change memory structure, a first bit line, and a second bit line comprises:
- forming a first dielectric layer, wherein the first dielectric layer covers the transistor;
- forming a first interconnecting hole in the first dielectric layer, wherein the first interconnecting hole exposes the first terminal of the transistor;
- forming a first plug in the first interconnecting hole, and forming the first interconnecting line on an upper surface of the first dielectric layer, wherein the first interconnecting line is connected to the first terminal of the transistor through the first plug;
- forming a second dielectric layer on the first dielectric layer, and forming a second interconnecting hole in the second dielectric layer, wherein the second interconnecting hole exposes the first interconnecting line; and simultaneously, forming a fifth interconnecting hole in the second dielectric layer;
- forming a second plug in the second interconnecting hole; and simultaneously, forming a fifth plug in the fifth interconnecting hole;
- forming a third dielectric layer, a fourth dielectric layer, and a fifth dielectric layer that are sequentially stacked on the second dielectric layer, and forming the first phase change memory structure in the third dielectric layer, the fourth dielectric layer, and the fifth dielectric layer, wherein the bottom electrode of the first phase change memory structure is connected to the first interconnecting line through the second plug; and simultaneously, forming a second interconnecting line in the third dielectric layer, wherein a gap exists between the second interconnecting line and the bottom electrode of the first phase change memory structure, and the gap between the second interconnecting line and the bottom electrode of the first phase change memory structure is filled with the third dielectric layer;
- forming a sixth dielectric layer on the fifth dielectric layer, and forming a third interconnecting hole in the sixth dielectric layer, wherein the third interconnecting hole exposes the top electrode of the first phase change memory structure;

forming a third plug in the third interconnecting hole, and forming the first bit line on the sixth dielectric layer, wherein the first bit line is electrically connected to the top electrode of the first phase change memory structure through the third plug;

forming a seventh dielectric layer on the sixth dielectric layer, wherein the seventh dielectric layer covers the first bit line;

forming a ninth interconnecting hole in the seventh dielectric layer, the sixth dielectric layer, the fifth dielectric layer, and the fourth dielectric layer, wherein the ninth interconnecting hole exposes the second interconnecting line;

forming a ninth plug in the ninth interconnecting hole, forming an eighth dielectric layer and a ninth dielectric layer that are sequentially stacked on the seventh dielectric layer, and forming the second phase change memory structure in the eighth dielectric layer and the ninth dielectric layer, wherein the top electrode of the second phase change memory structure is connected to the second interconnecting line through the ninth plug;

forming a tenth dielectric layer on the ninth dielectric layer, and forming a fourth interconnecting hole in the tenth dielectric layer, wherein the fourth interconnecting hole exposes the bottom electrode of the second phase change memory structure; and forming a fourth plug in the fourth interconnecting hole, and forming the second bit line on the tenth dielectric layer, wherein the second bit line is electrically connected to the bottom electrode of the second phase change memory structure through the fourth plug.

15. The manufacturing method of a semiconductor structure according to claim 14, wherein the forming an eighth dielectric layer and a ninth dielectric layer that are sequentially stacked on the seventh dielectric layer, and forming the second phase change memory structure in the eighth dielectric layer and the ninth dielectric layer comprises:

forming the top electrode of the second phase change memory structure on the seventh dielectric layer;

forming the eighth dielectric layer on the seventh dielectric layer, wherein the top electrode of the second phase change memory structure is located in the eighth dielectric layer;

forming a through hole in the eighth dielectric layer, wherein the through hole is arranged corresponding to the top electrode of the second phase change memory structure, and exposes the top electrode of the second phase change memory structure;

forming a phase change layer and a heating structure in the through hole; and forming the bottom electrode of the second phase change memory structure on the eighth dielectric layer, wherein the bottom electrode of the second phase change memory structure is in contact with the heating structure; and forming the ninth dielectric layer on the eighth dielectric layer, wherein the ninth dielectric layer covers a surface of an exposed portion of the eighth dielectric layer.

16. The manufacturing method of a semiconductor structure according to claim 15, wherein the forming a phase change layer and a heating structure in the through hole comprises:

forming a phase change material layer in the through hole and on an upper surface of the eighth dielectric layer;

removing the phase change material layer located on the upper surface of the eighth dielectric layer, and etching back the phase change material layer located in the through hole, to obtain the phase change layer whose upper surface is lower than a top of the through hole;

forming a heating material layer in the through hole and on the upper surface of the eighth dielectric layer; and removing the heating material layer located on the upper surface of the eighth dielectric layer, and reserving the heating material layer located in the through hole to obtain the heating structure.

17. The manufacturing method of a semiconductor structure according to claim 8, wherein the forming a first phase change memory structure, a second phase change memory structure, a first bit line, and a second bit line comprises:

forming a first dielectric layer, wherein the first dielectric layer covers the transistor;

forming a first interconnecting hole in the first dielectric layer, wherein the first interconnecting hole exposes the first terminal of the transistor;

forming a first plug in the first interconnecting hole, and forming the first interconnecting line on an upper surface of the first dielectric layer, wherein the first interconnecting line is connected to the first terminal of the transistor through the first plug;

forming a second dielectric layer on the first dielectric layer, and forming a second interconnecting hole in the second dielectric layer, wherein the second interconnecting hole exposes the first interconnecting line; and simultaneously, forming a fifth interconnecting hole in the second dielectric layer;

forming a second plug in the second interconnecting hole; and simultaneously, forming a fifth plug in the fifth interconnecting hole;

forming a third dielectric layer, a fourth dielectric layer, and a fifth dielectric layer that are sequentially stacked on the second dielectric layer, and forming the first phase change memory structure and the second phase change memory structure in the third dielectric layer, the fourth dielectric layer, and the fifth dielectric layer, wherein the bottom electrode of the first phase change memory structure is connected to the first interconnecting line through the second plug, and the top electrode of the second phase change memory structure is connected to the first interconnecting line through the fifth plug;

forming a sixth dielectric layer on the fifth dielectric layer, and forming a third interconnecting hole and a fourth interconnecting hole in the sixth dielectric layer, wherein the third interconnecting hole exposes the top electrode of the first phase change memory structure, and the fourth interconnecting hole exposes the bottom electrode of the second phase change memory structure; and forming a third plug in the third interconnecting hole, forming a fourth plug in the fourth interconnecting hole, and forming the first bit line and the second bit line on the sixth dielectric layer, wherein the first bit line is electrically connected to the top electrode of the first phase change memory structure through the third plug, and the second bit line is electrically connected to the bottom electrode of the second phase change memory structure through the fourth plug.

18. The manufacturing method of a semiconductor structure according to claim 17, wherein the forming a third dielectric layer, a fourth dielectric layer, and a fifth dielectric layer that are sequentially stacked on the second dielectric layer, and forming the first phase change memory structure and the second phase change memory structure in the third dielectric layer, the fourth dielectric layer, and the fifth dielectric layer comprises:

forming, on the second dielectric layer, the bottom electrode of the first phase change memory structure and the top electrode of the second phase change memory structure that are spaced apart;

forming the third dielectric layer on the second dielectric layer, wherein both the bottom electrode of the first phase change memory structure and the top electrode of the second phase change memory structure are located in the third dielectric layer;

forming the fourth dielectric layer on the third dielectric layer, wherein the fourth dielectric layer covers the bottom electrode of the first phase change memory structure and the top electrode of the second phase change memory structure; and forming a first through hole in the fourth dielectric layer, wherein the first through hole is arranged corresponding to the bottom electrode of the first phase change memory structure and exposes the bottom electrode of the first phase change memory structure;

forming a heating structure of the first phase change memory structure in the first through hole;

forming a second through hole in the fourth dielectric layer, wherein the second through hole is arranged corresponding to the top electrode of the second phase change memory structure and exposes the top electrode of the second phase change memory structure;

forming a phase change material layer in the first through hole and the second through hole;

removing the phase change material layer located on an upper surface of the fourth dielectric layer, and etching back the phase change material layer located in the second through hole, to obtain a phase change layer, whose upper surface is flush with the fourth dielectric layer, of the first phase change memory structure, and a phase change layer, whose upper surface is lower than a top of the second through hole, of the second phase change memory structure;

forming a heating material layer in the second through hole and on the upper surface of the fourth dielectric layer; and removing the heating material layer located on the upper surface of the fourth dielectric layer, and reserving the heating material layer located in the second through hole to obtain a heating structure of the second phase change memory structure.

19. The manufacturing method of a semiconductor structure according to claim 18, wherein the forming a heating structure of the first phase change memory structure in the first through hole comprises:

forming the heating material layer in the first through hole and on the upper surface of the fourth dielectric layer; and removing the heating material layer located on the upper surface of the fourth dielectric layer, and etching back the heating material layer located in the first through hole, to obtain the heating structure, whose upper surface is lower than a top of the first through hole, of the first phase change memory structure.

20. A semiconductor structure, comprising:
a transistor;
a first phase change memory structure, a bottom electrode of the first phase change memory structure being electrically connected to a first terminal of the transistor;
a second phase change memory structure, a top electrode of the second phase change memory structure being electrically connected to the first terminal of the transistor;
a first bit line, electrically connected to a top electrode of the first phase change memory structure; and
a second bit line, electrically connected to a bottom electrode of the second phase change memory structure;
wherein the first phase change memory structure comprises the bottom electrode, a heating structure, a phase change layer, and the top electrode that are sequentially stacked from bottom to top; the second phase change memory structure comprises the top electrode, a phase change layer, a heating structure, and the bottom electrode that are sequentially stacked from bottom to top;
wherein one of:
the bottom electrode of the second phase change memory structure is higher than the top electrode of the first phase change memory structure, or
the bottom electrode of the second phase change memory structure is flush with the top electrode of the first phase change memory structure;
wherein the first bit line is located in a same layer with the second bit line.

* * * * *